(12) United States Patent
Matsuo et al.

(10) Patent No.: US 10,686,468 B2
(45) Date of Patent: Jun. 16, 2020

(54) DATA PROCESSING APPARATUS, MEMORY SYSTEM, AND METHOD OF PROCESSING DATA

(71) Applicant: TOSHIBA MEMORY CORPORATION, Tokyo (JP)

(72) Inventors: Takuya Matsuo, Kawasaki Kanagawa (JP); Atsushi Matsumura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/115,237

(22) Filed: Aug. 28, 2018

(65) Prior Publication Data

US 2019/0181881 A1    Jun. 13, 2019

(30) Foreign Application Priority Data

Dec. 8, 2017  (JP) .................................. 2017-235923

(51) Int. Cl.

| | |
|---|---|
| G06F 3/06 | (2006.01) |
| G06F 11/20 | (2006.01) |
| G06F 11/10 | (2006.01) |
| G06F 16/27 | (2019.01) |
| G06F 16/13 | (2019.01) |
| G06F 12/0873 | (2016.01) |
| G06F 16/172 | (2019.01) |
| G06F 12/0868 | (2016.01) |
| G06F 12/0866 | (2016.01) |
| H03M 7/40 | (2006.01) |
| G06F 9/38 | (2018.01) |
| G06F 12/02 | (2006.01) |

(Continued)

(52) U.S. Cl.
CPC ............ *H03M 7/40* (2013.01); *G06F 9/3806* (2013.01); *G06F 12/0246* (2013.01); *H03M 7/3075* (2013.01); *H03M 7/42* (2013.01); *H03M 7/607* (2013.01); *H04N 19/61* (2014.11)

(58) Field of Classification Search
CPC .......... H03M 7/40; H03M 7/42; H03M 7/607; H03M 7/3075; G06F 9/3806; G06F 12/0246; H04N 19/61
See application file for complete search history.

(56) References Cited

U.S. PATENT DOCUMENTS 9,047,177 B2   6/2015 Matsudaira et al.
9,996,461 B1 *  6/2018 Xu ...................... G06F 12/0292

(Continued)

FOREIGN PATENT DOCUMENTS

| JP | 2005301885 A | 10/2005 |
| JP | 2010146326 A | 7/2010 |
| JP | 2013196115 A | 9/2013 |

*Primary Examiner* — Charles Rones
*Assistant Examiner* — Tong B. Vo
(74) *Attorney, Agent, or Firm* — Kim & Stewart LLP

(57) ABSTRACT

A data processing apparatus for compressing physical address values correlated to logical address values includes a first prediction unit that calculates a first predicted address value for a first input address value in input data to be compressed, a determination unit that selects an encoding processing for the first input address value according to the first predicted address value, and a compression unit configured to encode the first input address value according to the encoding processing selected by the determination unit.

18 Claims, 16 Drawing Sheets

(51) Int. Cl.
*H04N 19/61* (2014.01)
*H03M 7/42* (2006.01)
*H03M 7/30* (2006.01)

(56) References Cited

U.S. PATENT DOCUMENTS

| | | | |
|---|---|---|---|
| 2010/0161887 A1 | 6/2010 | Nakazumi | |
| 2011/0200099 A1* | 8/2011 | Kim | H04N 19/139 375/240.02 |
| 2013/0246689 A1* | 9/2013 | Matsudaira | G06F 12/0246 711/103 |
| 2018/0060073 A1* | 3/2018 | Havlir | G06F 9/3806 |

\* cited by examiner

DATA PROCESSING APPARATUS, MEMORY SYSTEM, AND METHOD OF PROCESSING DATA

CROSS-REFERENCE TO RELATED APPLICATIONS

This application is based upon and claims the benefit of priority from Japanese Patent Application No. 2017-235923, filed Dec. 8, 2017, the entire contents of which are incorporated herein by reference.

FIELD

Embodiments described herein relate generally to a data processing apparatus, a memory system, and a method of processing data.

BACKGROUND

In general, a memory apparatus holds an address conversion table (referred to as a logical-physical conversion table) for correlating a logical address used when a host, a program, or the like accesses data with a physical address indicating a physical position on a device where the data is actually stored in order to manage the data.

DETAILED DESCRIPTION

Example embodiments of the present disclosure provide a data processing apparatus, a memory system, and a method of processing data that are capable of reducing a data size of a logical-physical conversion table.

In general, according to one embodiment, a data processing apparatus for compressing physical address values correlated to logical address values includes a first prediction unit that calculates a first predicted address value for a first input address value in input data to be compressed; a determination unit that selects an encoding processing for the first input address value according to the first predicted address value; and a compression unit configured to encode the first input address value according to the encoding processing selected by the determination unit.

A data processing apparatus, a memory system, and a method of processing data according to certain example embodiments will be described with reference to accompanying drawings. The present disclosure is not limited to the following example embodiments. In general, various embodiments provide improvements over existing systems, such as by reducing storage size of necessary logical-to-physical correlation tables and/or improving transfer rates associated with loading some or all of a logical-to-physical correlation table into processor cache or other accessible memory units from a non-volatile storage location or the like.

First Embodiment

Figure 1:
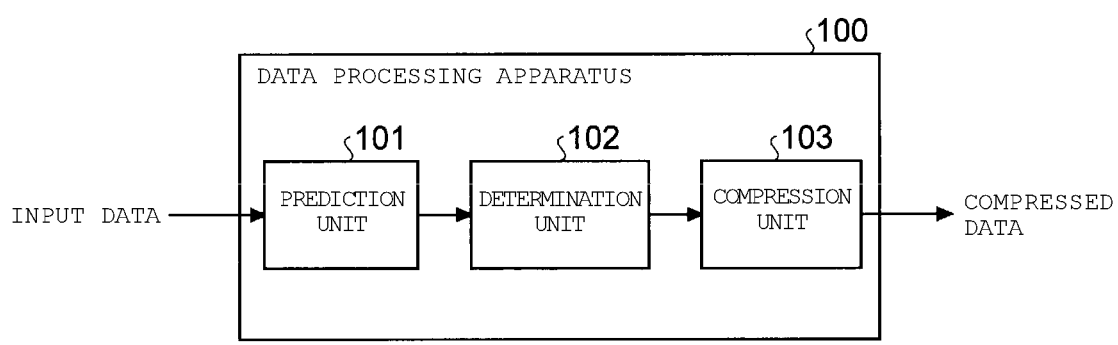
FIG. 1 is a block diagram showing a schematic configuration example of a data processing apparatus according to a first embodiment.

FIG. 1 is a block diagram showing a schematic configuration example of a data processing apparatus according to the first embodiment. As shown in FIG. 1, a data processing apparatus 100 includes a prediction unit 101, a determination unit 102, and a compression unit 103. The prediction unit 101, the determination unit 102, and the compression unit 103 may each be implemented in hardware such as a system-on-a-chip (SoC) and a processor, processors, controllers, microcontroller units, and/or circuits thereon, therein, or otherwise. The prediction unit 101, the determination unit 102, and the compression unit 103 may be separately or collectively implemented in application specific hardware, dedicated processors and/or controllers, or one or more processors (such as central processing units) executing firmware or software.

Data including data that is to be compressed (hereinafter, referred to for simplicity as input data) is input to the data processing apparatus 100. The data to be compressed is, for example, a part or all of a correlation between address such as a look-up table (also referred to as logical-physical conversion table) including a correlation between a physical address within a physical storage address space and a logical address within a logical storage address space of a memory storage unit or units. For example, in a case where the input data is a logical-physical conversion table, the data to be compressed can be a part or all of the physical addresses included in the logical-physical conversion table. Hereinafter, the case where the data to be compressed are the physical addresses of the logical-physical conversion table will be described as an example. Thus, in this example case, "address data" in the following description refers to a physical address correlated with a logical address. When the data to be compressed is the physical address, the logical address is not required to be included in the input data. If the input data does not include the logical address, the logical address corresponding to the physical address in the input data may be separately managed using a predetermined memory structure or may be managed by adding metadata such as "logical address: physical addresses from 0x00000000 to 0xFFFFFFFF" or "logical address: 1000 physical addresses beyond 0x00000000" to the compressed data generated by the compression unit 103 described below.

The prediction unit 101 calculates a prediction value for the data to be compressed (e.g., address data) that is included in the input data provided to the data processing apparatus 100. Specifically, the prediction unit 101 sequentially orders address data in the input data according to, for example, a round robin method to calculate a prediction value for address data being processed at the present time based on previously processed address data. For example, the prediction unit 101 calculates the prediction value for the to-be-processed address data based on address data which was previously processed (hereinafter, referred to as processed address data). The prediction value is a physical address predicted for address data to be processed.

For example, the prediction unit 101 calculates a prediction value pred (n) for the n-th address data adr (n) based on a previously processed address adr (n−m), where n is an integer equal to or larger than 1 and m is an integer between 1 and n−1. The prediction value pred (n) calculated in this manner can be, for example, adr (n−m)+α, where α is some predetermined value. Specifically, in a case where m is 1, the prediction unit 101 calculates a prediction value pred (n)=adr (n−1)+α for the address data adr (n) based on a processed address adr (n−1) that was processed immediately before the address data adr (n).

However, in a case (e.g., n=1) where the address data to be processed is first address data adr (1), there will be no previously processed address on which to base the calculating of the prediction value pred (n). In this case, a predetermined prediction value may be set in advance and used as a prediction value pred (1) for the first address data adr (1) or alternatively obtaining a prediction value may be omitted for the first address data adr (1).

The value of m need not be a fixed value. For example, m may be set such that pieces of address data in the input data are divided into two or more groups and prediction values are calculated using the same processed address for the address data belonging to each of groups. A prediction value pred (n)=adr (1)+αn for second and subsequent address data adr (n) may be calculated based on the processed address adr (1) obtained for the first address data adr (1) in the input data. In the case, m is a distance (interval) in the processing sequence between the address data adr (n) to be processed and the first address data adr (1), that is, m=n−1.

The determination unit 102 determines encoding processing executed by the compression unit 103 based on a difference value diff (n) between the address data adr (n) to be processed and the prediction value pred (n) calculated by the prediction unit 101. For example, the determination unit 102 performs a threshold value determination based on an absolute value of the difference value diff (n) to determine the encoding processing to be executed by the compression unit 103. When the absolute value of the difference value diff (n) is equal to or less than a threshold value, the determination unit 102 selects or sets a first encoding processing as the encoding processing to be executed by the compression unit 103 for the address data adr (n). When the absolute value of the difference value diff (n) is larger than the threshold value, the determination unit 102 selects or sets a second of encoding processing, different from the first encoding processing, as the encoding processing to be executed by the compression unit 103 for the address data adr (n).

The threshold value used for the threshold value determination may be a predetermined value. The threshold value may be a bit number N bit, where N is natural number, or a real number. Furthermore, the threshold value may be changed during an operation. For example, in a case where a determination result that the absolute value of the difference value diff (n) is equal to or less than a threshold value N bit and this repeats for a certain number of times or more in the course of the processing operation, the determination unit 102 may decrement the threshold value by 1 to obtain N−1 bit and may then operate so as to reset the threshold value to N bit in a case where the absolute value of the difference value diff (n) becomes larger than a threshold value (N−1 bit) in a subsequent operation.

In a case where the difference value diff (n) is equal to zero, the determination unit 102 may select or set a third encoding processing, different from the first encoding processing and the second encoding processing, as the encoding processing executed by the compression unit 103 for the address data adr (n). Additionally, in a case where a specific address such as an address of a known defective block is the address data to be processed, the determination unit 102 may select or set a fourth encoding processing, different from encoding processings described above, as the encoding processing executed by the compression unit 103.

Furthermore, the determination unit 102 sets information for specifying the encoding processing for the each address data adr (n) to be processed. For example, a processing flag flag (n) may be used as the information.

A flag value having a sufficient number of bits is used as the processing flag flag (n) to individually specify the encoding processing executed by the compression unit 103. For example, in a case where the compression unit 103 executes three different types of encoding processing, a two-bit flag capable of taking three or more values may be used as the processing flag flag (n). In the following description, a two-bit flag is used as the processing flag flag (n) A processing flag flag (n) value indicating the first encoding processing is set to "00", a processing flag flag (n) value indicating the second encoding processing is set to "01", and a processing flag flag (n) value indicating the third encoding processing is set to "10".

The compression unit 103 compresses the input data according to the encoding processing set by the determination unit 102 and outputs compressed data obtained by the compression. Specifically, the compression unit 103 executes the selected encoding processing (e.g., first encoding processing, second encoding processing, third encoding processing, or the like) for each of the address data adr (n) in the input data and generates compressed data having a data size that is reduced compared with the input data.

For example, in the portion of the input data for which the first encoding processing is used, the compression unit 103 encodes the difference value diff (n) between the address data adr (n) to be processed and the prediction value pred (n) as calculated by the prediction unit 101. Specifically, the compression unit 103 outputs the difference value diff (n) between the address data adr (n) to be processed and the prediction value pred (n) and the processing flag flag (n) (value=00) for the address data adr (n) as results (encoded data).

In the portion of the input data for which the second encoding processing is used, the compression unit 103 encodes the address data adr (n) to be processed. Specifically, the compression unit 103 outputs the address data adr (n) to be processed itself (unchanged) and the processing flag flag (n) (value=01) for the address data adr (n) as results (encoded data).

Furthermore, for the portion of the input data for which the third encoding processing is used, the compression unit 103 encodes the processing flag flag (n) set for the address data adr (n) to be processed. That is, the compression unit 103 outputs the processing flag flag (n) (value=10) for the address data adr (n) being processed as a result (encoded data) the.

Next, a flow from the reception of the input data to the output of the compressed data by the data processing apparatus 100 will be described using an example shown in FIG. 2. In the example shown in FIG. 2, input data is assumed to be a physical address respectively correlated with logical addresses 1 to 10. It is assumed that m=1, α=1, and the threshold value used for the threshold value determination by the determination unit 102 is a two-bit value. Furthermore, the physical address 0xFFFFFFFF is assumed to be an invalid address.

In the logical-physical conversion table used for the generation (or extraction) of the input data, the continuous physical addresses 0x00000000 to 0x00000002 are respectively correlated with the logical address 1 to 3. The physical address 0xFFFFFFFF, which is the invalid address, is correlated with each of the logical addresses 4 to 6. Furthermore, continuous physical addresses 0x00000006 and 0x00000007 are respectively correlated with the logical addresses 7 and 8. Furthermore, one non-continuous physical address 0x00000009 (that is, a physical address 0x00000008 is "skipped" in the input data of this example between 0x00000007 and 0x00000009) and a physical address 0x0000000B are respectively correlated with the logical addresses 9 and 10.

The input data provided to the data processing apparatus 100 is input to the prediction unit 101, followed by the determination unit 102, and then followed by the compression unit 103. The transfer of data between these units may be direct or otherwise via another unit or units interposed between the specifically depicted units. The prediction unit 101 sequentially selects each physical address as the address data adr (n) to be processed (n is an integer from 1 to 10 in the example) according to, for example, a round robin method. Then, the prediction unit 101 sequentially calculates a prediction value pred (n) (=adr (n−m)+α) for address data adr (n) selected. In the example shown FIG. 2, continuous physical addresses 0x00000001 to 0x00000003 are calculated as prediction values pred (2) to pred (4) for physical addresses adr (2) to adr (4) correlated with the logical addresses 2 to 4, a physical address 0x00000000 is calculated as prediction values pred (5) to pred (7) for physical addresses adr (5) to adr (7) correlated with the logical addresses 5 to 7, continuous physical addresses 0x00000007 and 0x00000008 are calculated as prediction values pred (8) and pred (9) for physical addresses adr (8) and adr (9) correlated with the logical addresses 8 and 9, and a physical address 0x0000000A next to the immediately preceding physical address adr (9) (=0x00000009) is calculated as a prediction value pred (9) for a physical address adr (10) correlated with the logical address 10. In the case where n is 1, that is, for the head address data adr (1), there is no address data that has been processed before the head address data adr (1). Therefore, in this processing example, the prediction unit 101 selects a predetermined prediction value that has been set in advance as a prediction value pred (1) for the address data adr (1) and there is no calculating required for the prediction value of the address data adr (1). Subsequently, the prediction unit 101 supplies the prediction values pred (n) (n=1 to 10) calculated or selected for each of the address data adr (n) (n=1 to 10) to the determination unit 102.

The determination unit 102 subtracts the prediction value pred (n) from the corresponding address data adr (n) to calculate a difference value diff (n)=adr (n)−pred (n) In the example, a value in which a difference value diff (1) is equal to or larger than a threshold value (two in the example) is set as the prediction value pred (1) for the head address data adr (1).

Subsequently, the determination unit 102 performs the threshold value determination on the calculated difference value diff (n) and specifies a processing flag flag (n) for specifying the encoding processing to be executed by the compression unit 103 for each of the address data adr (n) based on a result of the threshold value determination.

Subsequently, the determination unit 102 sends the difference value diff (n) calculated for each of the address data adr (n) and the processing flag flag (n) specified for each of the address data adr (n) to the compression unit 103.

The compression unit 103 specifies the encoding processing for each of the input address data adr (n) according to the processing flag flag (n) for each of the address data adr (n). Subsequently, the compression unit 103 executes the encoding processing of each of the address data adr (n) according to the encoding processing specified for each of the address data adr (n). In the example shown in FIG. 2, for example, the compression unit 103 executes the first encoding processing of outputting the processing flag flag (n) (=00) and difference value diff (9) or diff (10) as encoded data cd (9) and cd (10) for the address data adr (9) and adr (10) for which the first encoding processing has been specified. The compression unit 103 executes the second encoding processing of outputting the processing flag flag (n) (=01) along with the address data adr (1), adr (4), adr (5), adr (6), and adr (7) as encoded data cd (1), cd (4), cd (5), cd (6), and cd (7) for the address data adr (1), adr (4), adr (5), adr (6), and adr (7), respectively, for which the second encoding processing has been specified. Furthermore, the compression unit 103 executes the third encoding processing of outputting the processing flag flag (n) (=10) as encoded data cd (2), cd (3), and cd (8) for the address data adr (2), adr (3), and adr (8), respectively, for which the third encoding processing has been specified.

The compressed data (encoded data cd (n)) output from the compression unit 103 has a data size that is reduced compared to the input data supplied to the data processing apparatus 100. The compressed data output from the compression unit 103 may be further encoded by, for example, variable-length encoding such as Huffman coding. Accordingly, it is possible to further compress the data.

Figure 3:
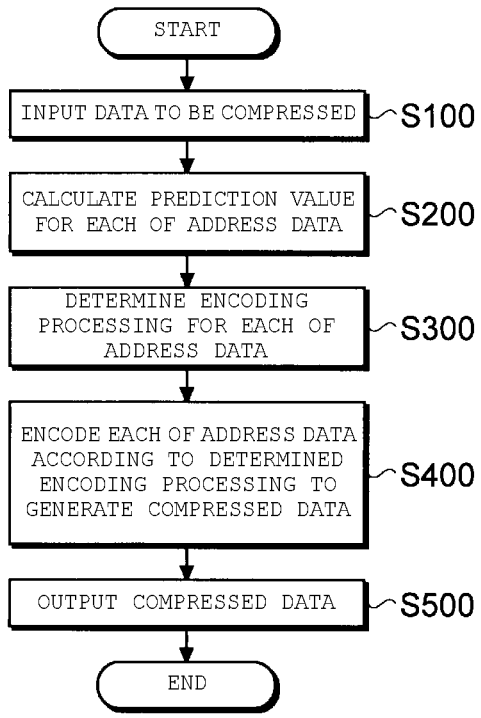
FIG. 3 is a flowchart showing an example of a compression operation executed by a data processing apparatus according to a first embodiment.

Next, an operation example of the data processing apparatus 100 according to the embodiment will be described in details using the drawings. FIG. 3 is a flowchart showing an example of a compression operation executed by the data processing apparatus according to the embodiment.

As shown in FIG. 3, in the compression operation according to the embodiment, the data processing apparatus 100 first receives the data to be compressed (referred to as "input data") from an external source (step S100). Next, the data processing apparatus 100 provides the input data to the prediction unit 101, which calculates a prediction value pred (n) for each address data adr (n) of the input data (step S200). Next, the data processing apparatus 100 provides the input data and the calculated prediction value pred (n) to the determination unit 102, which calculates a difference value diff (n) between the address data adr (n) and the respective prediction value pred (n) via subtraction. The determination unit 102 performs a threshold value determination on the calculated difference value diff (n) and accordingly selects the encoding processing for each address data adr (n) included in the input data (step S300). Next, the data processing apparatus 100 sends a processing flag flag (n), the difference value diff (n), and the selection of the encoding processing for each of the address data adr (n) to the compression unit 103, which encodes each of the address data adr (n) according to the encoding processing reflected by the processing flag flag (n) and thus generates compressed data from the input data (step S400). Subsequently, the data processing apparatus 100 outputs the generated compressed data (step S500) and ends the operation.

Figure 4:
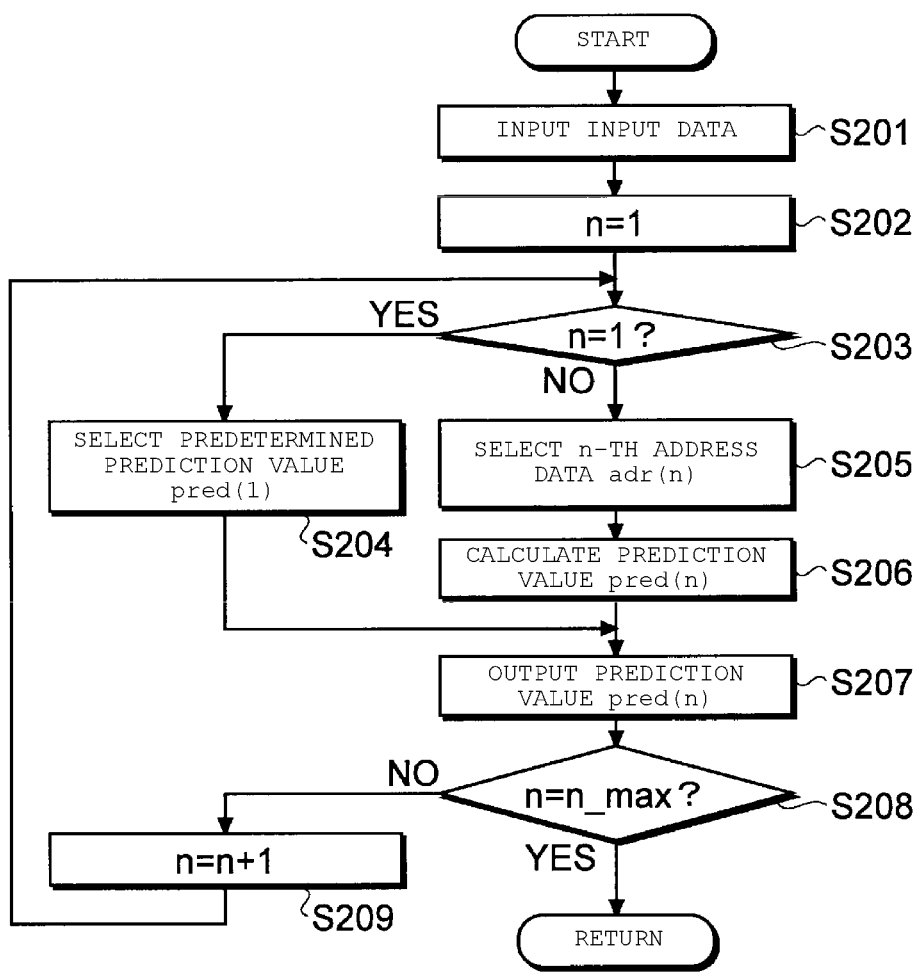
FIG. 4 is a flowchart showing an example of a prediction value calculation operation according to a first embodiment.

A prediction value calculation operation executed by the prediction unit 101 in step S200 of FIG. 3 will be described. FIG. 4 is a flowchart showing an example of the prediction value calculation operation according to this embodiment.

As shown in FIG. 4, when the input data is input (step S201), the prediction unit 101 begins with n=1 for specifying the address data to be processed in the input data (step S202).

Next, the prediction unit 101 determines whether n is 1, that is, the address data adr (n) to be processed is the head address data adr (1) (step S203). In a case where n=1 (YES in step S203), the prediction unit 101 selects a predetermined prediction value pred (1) as the prediction value for the address data adr (1) (step S204) and proceeds to step S207. In a case where n≠1 (NO in step S203), the prediction unit 101 selects n-th address data adr (n) in the input data as the address data adr (n) to be processed (step S205). Subsequently, the prediction unit 101 calculates a prediction value pred (n) according to the equation pred (n)=adr (n−m)+α, for example, based on the processed address data adr (n−m) processed m spots before the present address data adr (n) being processed (step S206) and proceeds to step S207. In the description, m is assumed to be 1 for convenience of explanation. In step S204, the prediction unit 101 sets the predetermined prediction value pred (1) as the prediction value for only the head address data adr (1). However, the present disclosure is not limited thereto, and the prediction value for the head address data adr (1) may be determined as, for example, null.

In step S207, the prediction unit 101 outputs the set or calculated prediction value pred (n) to the determination unit 102. However, the prediction unit 101 may store the calculated prediction values pred (n) in a predetermined memory area and may output these prediction values pred (n) to the determination unit 102 as a group after the calculation of the prediction values pred (n) for all the address data adr (n) is completed. Next, the prediction unit 101 determines whether n is the maximum value n_max for n, that is, whether address data adr (n) being selected is the last address data adr (n_max) in the input data (step S208). When n is presently not the maximum value n_max (NO in step S208), the prediction unit 101 proceeds to step S209, increments n by 1 and returns to step S203. In a case where n is the maximum value n_max (YES in step S208), the prediction unit 101 returns to the operation shown in FIG. 3.

Figure 5:
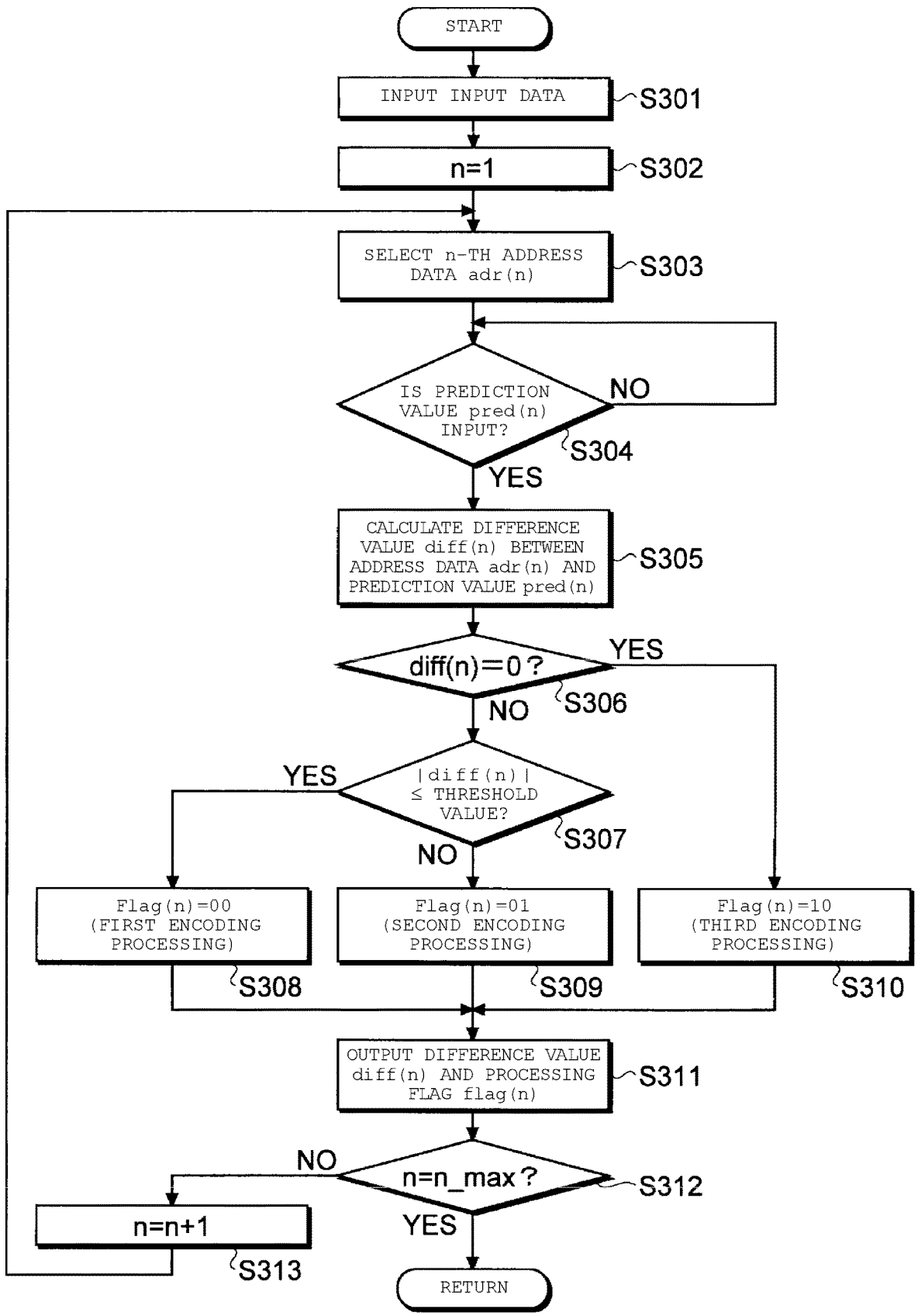
FIG. 5 is a flowchart showing an example of an encoding processing determination operation according to a first embodiment.

Subsequently, an encoding processing determination operation executed by the determination unit 102 in step S300 of FIG. 3 will be described. FIG. 5 is a flowchart showing an example of the encoding processing determination operation according to the embodiment. An operation shown in FIG. 5, that is, the operation in step S300 of FIG. 3 may be so-called pipeline processing which is sequentially executed in parallel during the execution of the operation of the prediction unit 101 shown in FIG. 4.

As shown in FIG. 5, when the input data is input to the prediction unit 101 (step S301), the determination unit 102 substitutes n=1 for specifying the address data to be processed (step S302) and then selects the n-th address data adr (n) in the input data to be processed (step S303). Subsequently, the determination unit 102 waits for a prediction value pred (n) for address data adr (n) to be input from the prediction unit 101 (NO in step S304). Once the prediction value pred (n) is input (YES in step S304), the determination unit 102 calculates a difference value diff (n) between the selected address data adr (n) and the inputted prediction value pred (n) (step S305). The difference value diff (n) is calculated for each of the address data adr (n) in step S305 and stored in the predetermined memory area.

Next, the determination unit 102 determines whether the calculated difference value diff (n) is zero (step S306). In a case where the difference value diff (n) is zero (YES in step S306), the determination unit 102 proceeds to step S310, sets "10" (designating third encoding processing) in the processing flag flag (n) for the address data adr (n), and proceeds to step S311. In a case where the difference value diff (n) is not zero (NO in step S306), the determination unit 102 executes the threshold value determination on the absolute value of the difference value diff (n) (step S307).

In a case where the absolute value of the difference value diff (n) is equal to or less than the threshold value (YES in step S307), the determination unit 102 proceeds to step S308, sets "00" (designating the first encoding processing) in the processing flag flag (n) for the address data adr (n), and proceeds to step S311. In a case where the absolute value of the difference value diff (n) is larger than the threshold value (NO in step S307), the determination unit 102 proceeds to step S309, sets "01" (designating the second encoding processing) in the processing flag flag (n) for the address data adr (n), and proceeds to step S311.

The processing flags flag (n) set in steps S308 to S310 are managed in, for example, a flag memory region or area.

In step S311, the determination unit 102 outputs the calculated difference value diff (n) for each address data adr (n) and the corresponding processing flag flag (n) to the compression unit 103. Subsequently, the determination unit 102 determines whether n has reached the maximum value n_S312). In a case where n is not the maximum value n_max (NO in step S312), the determination unit 102 proceeds to step S313, increments n by 1, and returns to step S303. In a case where n is the maximum value n_max (YES in step S312), the determination unit 102 returns to the operation shown in FIG. 3.

Figure 6:
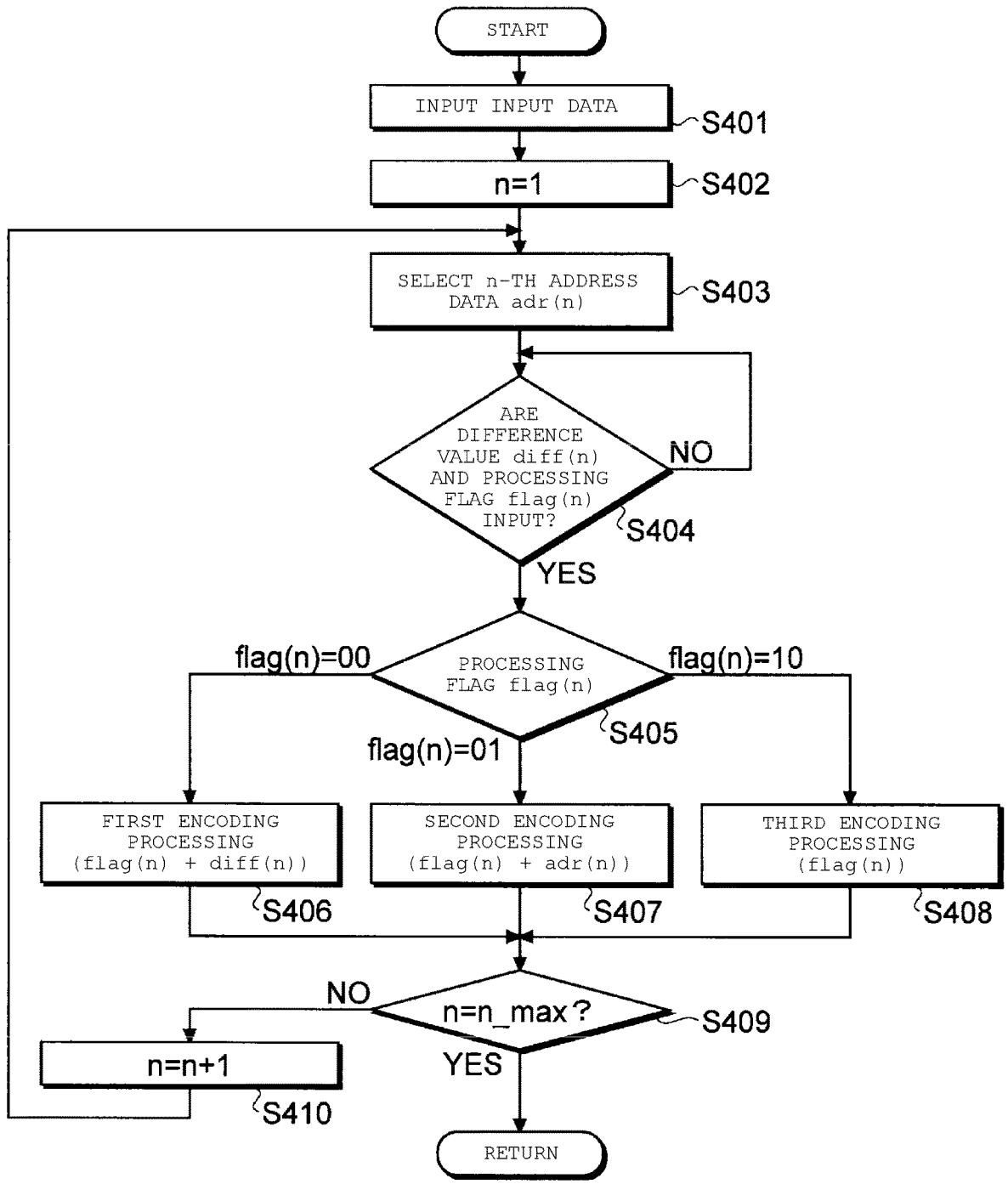
FIG. 6 is a flowchart showing an example of a compression operation according to a first embodiment.

The compression operation executed by the compression unit 103 in step S400 of FIG. 3 will be described. FIG. 6 is a flowchart showing an example of the compression operation according to an embodiment. The operation depicted in FIG. 6, corresponds to the operation performed in step S400 of FIG. 3 and may be, as an example, so-called "pipeline processing" which is executed during the execution of the operation of the determination unit 102 shown in FIG. 5.

As shown in FIG. 6, when the input data is input to the determination unit 102 (step S401), the compression unit 103 sets n=1 (step S402) and then selects the n-th address data adr (n) in the input data as the address data adr (n) to be processed (step S403).

Next, the compression unit 103 waits for a difference value diff (n) and a processing flag flag (n) for the selected address data adr (n) to be input from the determination unit 102 (NO in step S404) until the difference value diff (n) and the processing flag flag (n) are eventually input (YES in step S404), the compression unit 103 checks the processing flag flag (n) for the selected address data adr (n) (step S405). In a case where the processing flag flag (n) is "00" (flag (n)=00 in step S405), the compression unit 103 executes the first encoding processing of outputting the processing flag flag (n) and the difference value diff (n) as the encoded data cd (n) for the address data adr (n) (step S406) and proceeds to step S409.

In a case where the processing flag flag (n) is "01" (flag (n)=01 in step S405), the compression unit 103 executes the second encoding processing of outputting the processing flag flag (n) and the address data adr (n) as the encoded data cd (n) for the address data adr (n) (step S407) and proceeds to step S409.

In a case where the processing flag flag (n) is "10" (flag (n)=10 in step S405), the compression unit 103 executes the third encoding processing of outputting the processing flag flag (n) as the encoded data cd (n) for the address data adr (n) (step S408) and proceeds to step S409.

The encoded data output in the steps S406 to S408 is stored in the predetermined memory area.

In step S409, the compression unit 103 determines whether n is the maximum value n_max. In a case where n is not the maximum value n_max (NO in step S409), the compression unit 103 proceeds to step S410, increments n by 1, and returns to step S403. In a case where n is the maximum value n_max (YES in step S409), the compression unit 103 returns to the operation shown in FIG. 3. Accordingly, the compressed data is accumulated in the predetermined memory area.

According to the embodiment, as described above, for example, in a case where the address data adr (n) to be processed and the prediction value pred (n) coincide with each other or the difference value diff (n) therebetween is equal to or less than the threshold value, the encoding processing of excluding the address data adr (n) or of replacing the address data adr (n) with the difference value diff (n) is executed. As a result, it is possible to generate the compressed data in which the data amount is reduced with respect to the input data.

For example, in a case in which two continuous physical addresses in the physical address space are to be processed and a prediction value of a second physical address is set as a physical address obtained by incrementing the immediately preceding first physical address by 1, the second physical address is replaced with the processing flag flag (n) by the third encoding processing since the difference value diff (n) between the second physical address and the prediction value will be zero. As a result, the storage size of the logical-physical conversion table is reduced.

Second Embodiment

Next, a second embodiment will be described in details with reference to the drawings. Hereinafter, the description will be focused on differences from the first embodiment and discussion of aspects which are substantially similar to the first embodiment may be omitted.

A data processing apparatus according to the second embodiment may have the same configuration as the data processing apparatus 100 in the first embodiment. That is, a data processing apparatus 100 according to the second embodiment includes the prediction unit 101, the determination unit 102, and the compression unit 103 as shown in FIG. 1. However, in the second embodiment, the prediction unit 101 operates in a different manner.

When the prediction value pred (n) for an address data adr (n) is calculated, the prediction unit 101 according to the second embodiment calculates a different prediction value pred (n) according to whether the address adr (n−m) is valid data (a valid address) or invalid data (an invalid address), wherein in m is some integer value of at least 1.

Specifically, for example, when the processed address adr (n−m) is a valid address, the prediction unit 101 adds a first predetermined value $\alpha$ to the processed address adr (n−m) to calculate a first prediction value pred1 (n)=adr (n−m)+$\alpha$. When the processed address adr (n−m) is an invalid address, the prediction unit 101 adds a second predetermined value $\beta$, different from the first predetermined value $\alpha$, to the processed address adr (n−m) to calculate a second prediction value pred2 (n)=adr (n−m)+$\beta$. The second predetermined value $\beta$ may be any value other than the first predetermined value $\alpha$.

For example, in a case where m=1, $\alpha$=1, and $\beta$=0, the processed address adr (n−m) used for generating a prediction value is will be address data adr (n−1), that is the address data value that was processed immediately before the address data adr (n) being processed. Here, when the immediately preceding processed address adr (n−1) is the valid data, the prediction unit 101 adds $\alpha$ ($\alpha$=1 in this example) to the immediately preceding processed address adr (n−1) to calculate a first prediction value pred1 (n) according to pred1 (n)=adr (n−1)+1. When the immediately preceding processed address adr (n−1) happens to be invalid data, the prediction unit 101 keeps the immediately preceding processed address adr (n−1) unchanged as the second prediction value pred2 (n), since $\beta$=0 in this example.

With such an algorithm for the prediction value calculation, then if m=1, $\alpha$=1, and $\beta$=0 (as in the example described above), a difference value diff (n) calculated by the determination unit 102 for the second and subsequent address data adr (n) to be processed becomes zero when continuous valid addresses of the physical address space are the address data adr (n) being processed in sequence and also when invalid addresses are the address data adr (n) to be processed continuously. As a result, since the third encoding processing is selected as the encoding processing for above address data adr (n), it is possible to further reduce the data amount of the compressed data.

Whether each of the address data adr (n) in the input data is a valid address or an invalid address is assumed to be defined in advance. Specifically, a specific address value (0xFFFFFFFF or the like) may be set as the invalid address, or an invalid address in the physical address space may be specified in advance and the specified invalid addresses may be managed in a memory. There may be a plurality of invalid addresses. The invalid address is, for example, a physical address indicating a block in which a free block and invalid data are stored, a block that cannot be used due to a defect (such as cell errors), and the like.

Next, an operation example of the data processing apparatus 100 according to the second embodiment will be described. A compression operation executed by the data processing apparatus 100 according to the second embodiment may be similar to the compression operation explained using FIGS. 3 to 6 for the first embodiment. However, in the second embodiment, the prediction value calculation operation executed by the prediction unit 101 is replaced with the operation shown in FIG. 7.

Figure 7:
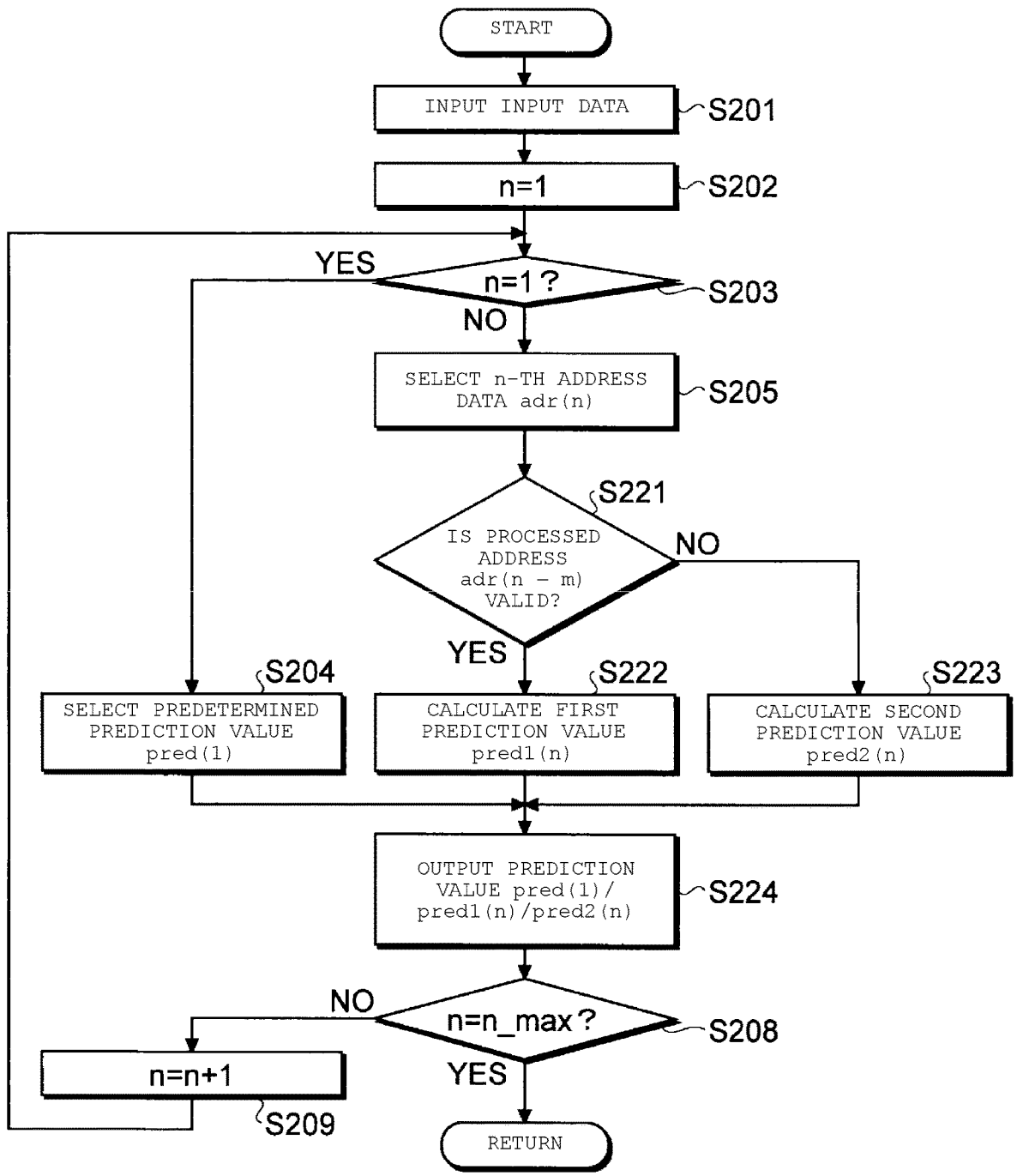
FIG. 7 is a flowchart showing an example of a prediction value calculation operation according to a second embodiment.

As shown in FIG. 7, in the prediction value calculation operation executed by the prediction unit 101 according to the second embodiment, the operations in steps S206 and S207 in FIG. 4 are replaced with operations shown in steps S221 to S224, with the other aspects (S201-S205, S208, and S209) being the same as in FIG. 4.

That is, in the second embodiment, when a selected address data adr (n) is not the head address data adr (1) (NO in step S203) and the prediction unit 101 selects the n-th address data adr (n) in the input data as the address data adr (n) to be processed (step S205), the prediction unit 101 subsequently determines whether the processed address adr (n−m) is a valid address (step S221). In a case where the processed address adr (n−m) is a valid address (YES in step S221), the prediction unit 101 calculates a first prediction value pred1 (n)=adr (n−m)+α using the first predetermined value α (step S222) and proceeds to step S224. In a case where the processed address adr (n−m) is an invalid address (NO in step S221), the prediction unit 101 calculates the second prediction value pred2 (n)=adr (n−m)+β using the second predetermined value β (step S223) and proceeds to step S224. In step S224, the prediction unit 101 outputs the predetermined prediction value pred (1) determined in step S204, the first prediction value pred1 (n) calculated in step S222, or the second prediction value pred2 (n) calculated in step S223 to the determination unit 102, similar to step S207 of FIG. 4.

According to the second embodiment, it is possible to adaptively switch the method of calculating the prediction value pred (n) according to whether the processed address adr (n−m) is a valid address or invalid address. For example, when m=1, α=1, and β=0, the difference value diff (n) calculated by the determination unit 102 for the second and subsequent address data adr (n) becomes zero in a period during which continuous valid addresses in the physical address space are processed and in the period during which the invalid addresses are be processed continuously. As a result, since third encoding processing is selected as the encoding processing for above address data adr (n), it is possible to further reduce the data amount of the compressed data.

Since other configurations, operations, and effects are the same as those in the first embodiment described above, a detailed description thereof will be omitted herein.

Third Embodiment

Next, a third embodiment will be described with reference to the drawings. Hereinafter, differences from the first embodiment and/or the second embodiment will mainly be described.

A data processing apparatus according to the third embodiment may have the same configuration as the data processing apparatus 100 in the first embodiment and the second embodiment. That is, the data processing apparatus 100 according to the third embodiment includes the prediction unit 101, the determination unit 102, and the compression unit 103 as shown in FIG. 1. However, in the third embodiment, the prediction unit 101 operates in the following manner.

When the prediction value pred (n) for the address data adr (n) is calculated, the prediction unit 101 according to the third embodiment calculates different prediction values pred (n) according to whether the processed address adr (n−m) is valid data (a valid address) or invalid data (an invalid address), as in the second embodiment. However, in the third embodiment, when address adr (n−m) is an invalid address and the address data adr (n) to be processed is a valid address, the prediction unit 101 calculates a different prediction value pred (n).

Specifically, when the processed address adr (n−m) is a valid address, the prediction unit 101 adds the first predetermined value α to the processed address adr (n−m) to calculate the first prediction value pred1 (n), as in the second embodiment. In a case where the processed address adr (n−m) is an invalid address and the address data adr (n) to be processed is also an invalid address, the prediction unit 101 adds the second predetermined value β to the processed address adr (n−m) to calculate the second prediction value pred2 (n). The second predetermined value β may be any value as with the first predetermined value α. Furthermore, in a case where the processed address adr (n−m) is the invalid address and the address data adr (n) to be processed is the valid address, the prediction unit 101 calculates a third prediction value pred3 (n) based on a processed address adr (n−k) (where k is an integer equal to or larger than 1 and less than n) which is the most recent valid address among all the processed addresses. The prediction unit adds a third predetermined value γ to the processed address adr (n−k) to calculate the third prediction value pred3 (n). The third predetermined value γ can be, for example, a distance L in the processing sequence from the processed address adr (n−k) (last determined valid address) to the current address data adr (n) being processed.

When m=1, α=1, β=0, and γ=L, the processed address adr (n−m) is set to address data adr (n−1) (that is the previously processed address that was processed immediately before the address data adr (n) currently being processed) or to the address data adr (n−k) (latest valid address). Here, when the immediately preceding processed address adr (n−1) is a valid address, the prediction unit 101 adds α (α=1) to the immediately preceding processed address adr (n−1) to calculate the first prediction value pred1 (n)=adr (n−1)+1. When the immediately preceding processed address adr (n−1) is an invalid address, the prediction unit 101 sets the immediately preceding processed address adr (n−1) as the second prediction value pred2 (n) (since β=0) if the address data adr (n) is also an invalid address and adds γ (γ=L) to the previously processed address adr (n−k) to calculate a third prediction value pred3 (n)=adr (n−k)+L when the address data adr (n) to be processed is a valid address.

Figure 8:
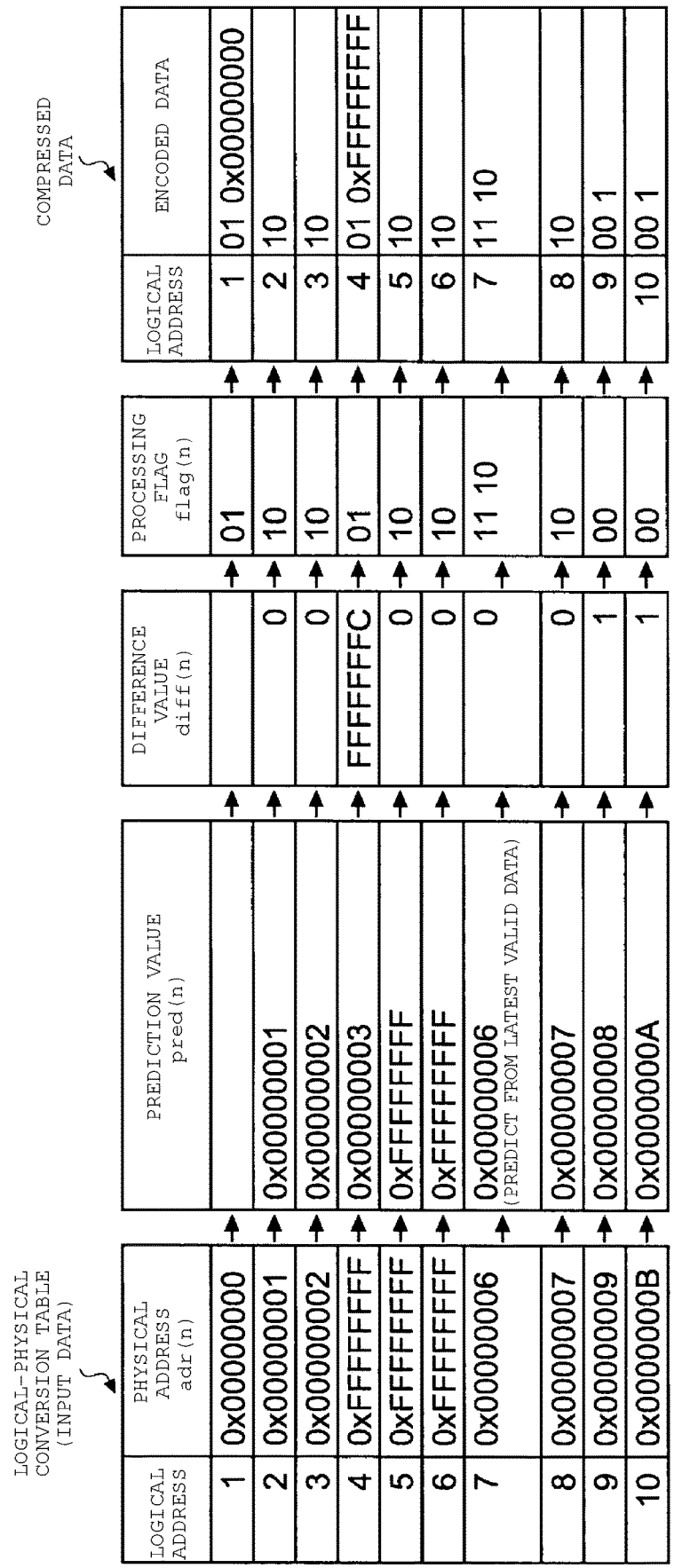
FIG. 8 is a table for describing an example of a flow from input data to an output of compressed data according to a third embodiment.

Here, a flow from the reception of the input data to the output of the compressed data by the data processing apparatus 100 according to the third embodiment will be described using FIG. 8. In FIG. 8, similarly to the example described using FIG. 2 for the first embodiment, it is assumed that the input data is physical addresses having a correspondence to logical addresses 1 to 10 in a logical-physical conversion table, the various parameter values are set to m=1, α=1, β=0, and γ=L, where L is the distance of the processing sequence (number of addresses processed) to the address adr (n−k), which is the latest valid address, from the address data adr (n) being processed, and the threshold value used for the threshold value determination by the determination unit 102 is a two-bit value. In addition, a physical address 0xFFFFFFFF is assumed for this example to be an invalid address or a designation of such.

Figure 2:
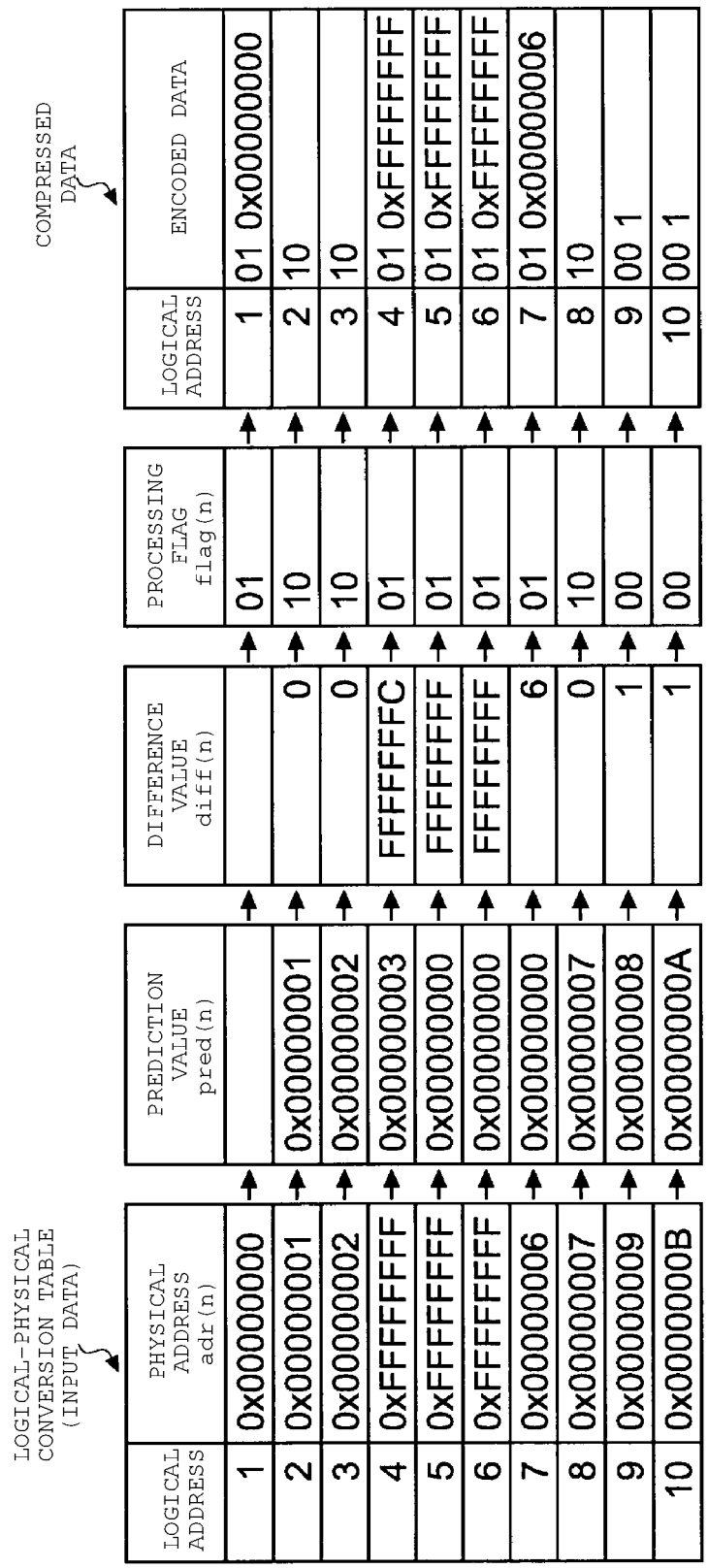
FIG. 2 is a table for describing an example of a flow from input data to an output of compressed data according to a first embodiment.

Similarly to the example shown in FIG. 2, in the logical-physical conversion table used for the generation (or extraction) of the input data, continuous physical addresses 0x00000000 to 0x00000002 are respectively correlated to the logical address 1 to 3 and the physical address 0xFFFFFFFF (which is an invalid address) is correlated to each of the logical addresses 4 to 6. In addition, continuous physical addresses 0x00000006 and 0x00000007 are respectively correlated to the logical addresses 7 and 8, and one skipped physical address 0x00000009 and a physical address 0x0000000B are respectively correlated to the logical addresses 9 and 10.

The prediction unit 101 sequentially selects the address data adr (n) to be processed according to, for example, a round robin method and sequentially calculates the prediction value pred (n) thereof for above input data. In the example shown FIG. 8, since the immediately preceding processed addresses are valid addresses for the physical addresses adr (2) to adr (4) and adr (8) to adr (10), prediction values pred1 (2) to pred1 (4) and pred1 (8) to pred1 (10) are respectively calculated from the immediately preceding processed addresses adr (1) to adr (3) and adr (7) to adr (9). On the other hand, since the immediately preceding processed addresses adr (4) and adr (5) are the invalid addresses and the physical addresses adr (5) and adr (6) are also the invalid addresses for the physical addresses adr (5) and adr (6), prediction values pred2 (5) and pred2 (6) are respectively calculated from the immediately preceding processed addresses adr (4) and adr (5). Furthermore, since the immediately preceding processed address adr (6) is the invalid address and the physical address adr (7) is the valid address for the physical address adr (7), prediction value pred3 (7) is calculated from the processed address adr (3) which is the latest valid address. In this case, since the distance L in the processing sequence from the physical data adr (7) being processed to the previously processed address adr (3), which is the latest valid address in the sequence, is 4 (L=4), the third predetermined value γ is thus set to 4 (γ=L=4).

The determination unit 102 and the compression unit 103 otherwise execute the same operations in the first embodiment for the prediction value pred (n) calculated as described above to obtain a difference value diff (n) and a processing flag flag (n), and execute encoding processing on the address data adr (n) based on the obtained processing flag flag (n) to generate compressed data. Consequently, in the example shown FIG. 8, a difference value diff (7) for the address data adr (7) is zero, and thus "10" indicating the third encoding processing is set as a processing flag flag (7) for the address data adr (7).

Note however, it is necessary to be able to specify that the latest valid address when calculating the prediction value for certain address data adr (n). Therefore, in the third embodiment, information indicating that the prediction value pred (n) was calculated using the latest valid address may be added to a processing flag (10 in the example) for specifying the encoding processing as exemplified by the processing flag flag (7) in FIG. 8. In order to distinguish the additional information from the processing flag, a value (for example, "11"), which is not otherwise used in designations of the processing flag, may be used.

Next, an operation example of the data processing apparatus 100 according to the third embodiment will be described. A compression operation executed by the data processing apparatus 100 according to the third embodiment may be the same as the compression operation exemplified using FIGS. 3 to 6 in the first embodiment. However, in the third embodiment, the prediction value calculation operation executed by the prediction unit 101 is replaced with the operation shown in FIG. 9.

Figure 9:
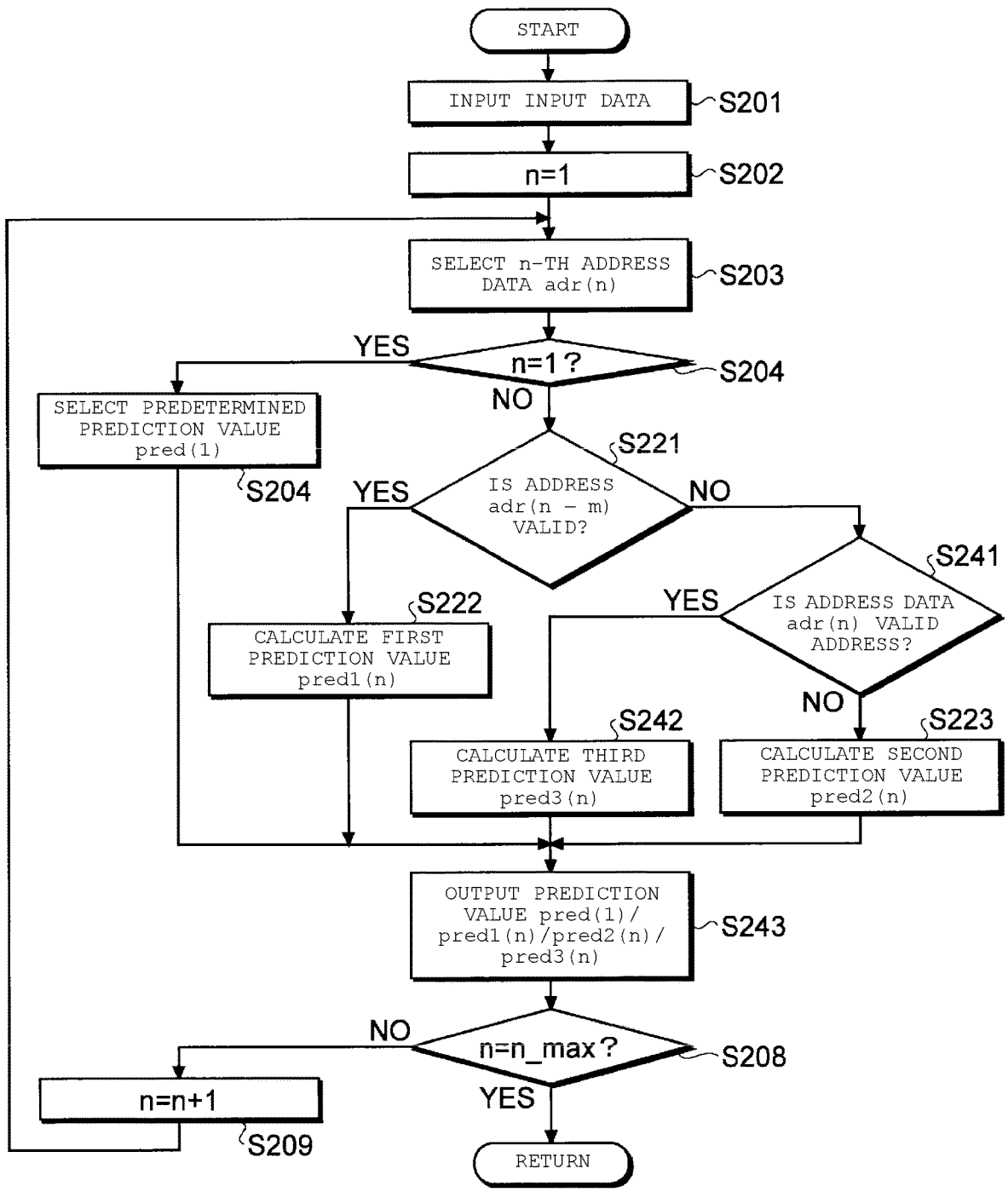
FIG. 9 is a flowchart showing an example of a prediction value calculation operation according to a third embodiment.

As shown in FIG. 9, in the prediction value calculation operation executed by the prediction unit 101 according to the third embodiment, the operations in steps S206 and S207 of FIG. 4 are replaced with operations shown in steps S221 to S223 and steps S241 to S243. The operations in steps S221 to S223 may be the same as the operations in steps S221 to S223 shown in FIG. 7.

That is, when the processed address adr (n−m) is not a valid address in the determination in step S221 (NO in step S221), the prediction unit 101 determines whether the address data adr (n) to be processed is a valid address (step S241). In a case where the address data adr (n) is not a valid address (NO in step S241), that is, both the processed address adr (n−m) and the address data adr (n) are invalid addresses, the prediction unit 101 calculates the second prediction value pred2 (n)=adr (n−m)+β for the invalid address using the second predetermined value β (step S223), and proceeds to step S243. In a case where the address data adr (n) is a valid address (YES in step S241), that is, the processed address adr (n−m) is an invalid address and the address data adr (n) is a valid address, the prediction unit 101 calculates a third prediction value pred3 (n)=adr (n−k)+γ using the third predetermined value γ set based on the processed address adr (n−k), which is the latest valid address among all the previously processed addresses (step S242) and proceeds to step S243. In step S243, the prediction unit 101 outputs the predetermined prediction value pred (1) determined in step S204, the first prediction value pred1 (n), the second prediction value pred2 (n), or a third prediction value pred3 (n) calculated in steps S222, S223, or S242 to the determination unit 102.

According to the third embodiment, it is possible to adaptively switch the method of calculating the prediction value pred (n) according to whether the address data adr (n) being processed is a valid address or an invalid address if the previously processed address adr (n−m) is an invalid address. Accordingly, for example, when the address data adr (n) being processed is switched from an invalid address to a valid address in a situation in which the processed addresses adr n−m) are continuously the invalid addresses, it is possible to calculate the prediction value pred (n) using the latest valid address. Specifically, for example, even in a case where apart of the middle of continuous valid addresses registered in the logical-physical conversion table is rewritten to invalid addresses, it is possible to calculate the prediction value pred (n) based on the latest valid address for a physical address that was switched from the invalid address to the valid address. As a result, since the encoded data cd (n) can be further reduced, it is possible to further reduce the data amount of the compressed data.

Since other configurations, operations, and effects are the same as those in the other embodiments described above, a detailed description thereof will be omitted herein.

Fourth Embodiment

In the fourth embodiment, a data processing apparatus is capable of expanding (decompressing) the compressed data obtained by the data processing apparatus 100 of any of the first to third embodiments. Hereinafter, the description will be focused on differences from the first to third embodiments.

Figure 10:
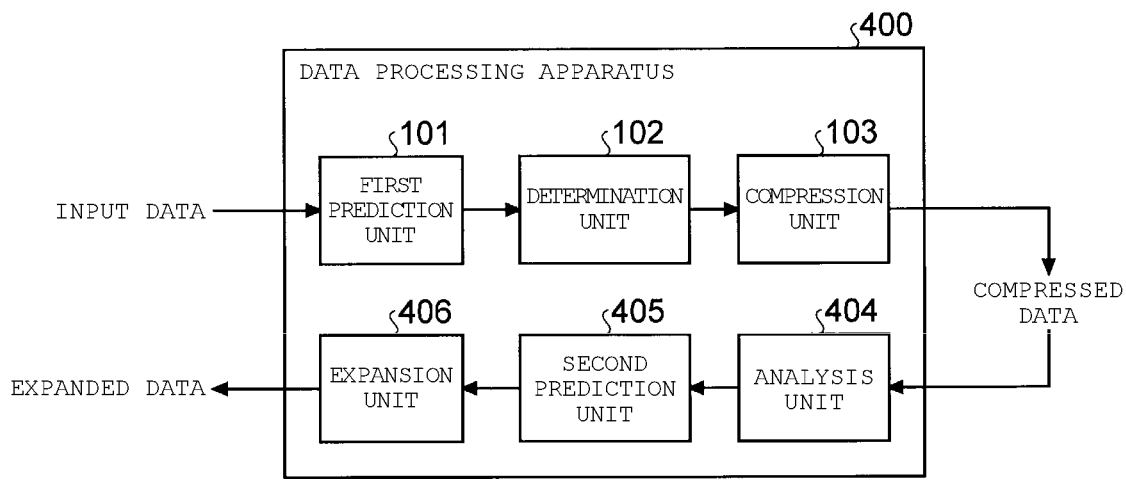
FIG. 10 is a block diagram showing a schematic configuration example of a data processing apparatus according to a fourth embodiment.

FIG. 10 is a block diagram showing a schematic configuration example of the data processing apparatus according to the fourth embodiment. In a data processing apparatus 400 shown in FIG. 10, the prediction unit 101, the determination unit 102, and the compression unit 103 for compressing the input data may be the same as the prediction unit 101, the determination unit 102, and the compression unit 103 of any of the first to third embodiments. However, for convenience of description, the prediction unit 101 will now be referred to as a first prediction unit 101 in this example.

The data processing apparatus 400 includes an analysis unit 404, a second prediction unit 405, and an expansion unit 406 for expanding the compressed data. The analysis unit 404, the second prediction unit 405, and the expansion unit 406 may be implemented by, for example, hardware such as a system-on-a-chip (SoC). The analysis unit 404, the second prediction unit 405, and the expansion unit 406 may be built in the same chip with the first prediction unit 101, the determination unit 102, and the compression unit 103.

In the fourth embodiment, since the configurations and the operations of the first prediction unit 101, the determination unit 102, and the compression unit 103 are the same as those in any of the first to third embodiments, a detailed description thereof will be omitted herein.

The analysis unit 404 analyzes each of the encoded data cd (n) in the compressed data to acquire the processing flag flag (n) and the like included in the encoded data cd (n) as analysis information. Specifically, the analysis unit 404 specifies the processing flag flag (n) included in each of the encoded data cd (n) as the analysis information and also specifies the address data adr (n) and the difference value diff (n) included in the encoded data cd (n) as a part of the analysis information as necessary. In a case where additional information indicating that a prediction value predD (n) was calculated using the latest valid address, the analysis unit 404 specifies the additional information as a part of the analysis information. Furthermore, in a case where the encoded data is further encoded by variable-length encoding or the like, the analysis unit 404 specifies information necessary for decoding the encoded data and the like as a part of the analysis information. Then, the analysis unit 404 sends the acquired analysis information and the compressed data to the second prediction unit 405.

When the compressed data and the analysis information are accepted from the analysis unit 404, the second prediction unit 405 calculates the prediction value predD (n) related to each of the encoded data cd (n) as necessary.

For example, in a case where compressed data was compressed by the first prediction unit 101, the determination unit 102, and the compression unit 103 as according to the first embodiment, if the encoded data cd (n) to be processed was encoded by the first encoding processing or the third encoding processing (as determined in the analysis information), the second prediction unit 405 calculates a prediction value predD (n)=dec (n−m)+$\alpha$ using a physical address (hereinafter, referred to as expanded address) dec (n−m) obtained by decoding processing executed before the encoded data cd (n). Here, m and $\alpha$ may be the same as in the first embodiment.

In a case where compressed data was compressed by the first prediction unit 101, the determination unit 102, and the compression unit 103 according to the second embodiment, if encoded data cd (n) is encoded by the first encoding processing or the third encoding processing, the second prediction unit 405 calculates a prediction value predD (n) using an expanded address dec (n−m). If the expanded address dec (n−m) is a valid address, the second prediction unit 405 calculates the prediction value predD (n)=dec (n−m)+$\alpha$ using the first predetermined value $\alpha$. When the expanded address dec (n−m) is an invalid address, the second prediction unit 405 calculates a prediction value predD (n)=dec (n−m)+$\beta$ using the second predetermined value $\beta$. Here, m, $\alpha$, and $\beta$ may be the same as in the second embodiment.

When compressed data is compressed by the first prediction unit 101, the determination unit 102, and the compression unit 103 according to the third embodiment, if encoded data cd (n) to was encoded by the first encoding processing or the third encoding, the second prediction unit 405 calculates a prediction value predD (n) using an expanded address dec (n−m). At the time, when the expanded address dec (n−m) is a valid address, the second prediction unit 405 calculates the prediction value predD (n)=dec (n−m)+$\alpha$ using the first predetermined value $\alpha$. When the expanded address dec (n−m) is an invalid address, the second prediction unit 405 determines whether to use an expanded address adr (n−k), which is the latest valid address, based on the analysis information (for example, additional information). The second prediction unit 405 calculates the prediction value predD (n)=dec (n−m)+$\beta$ using the second predetermined value $\beta$ for the expanded address adr (n−m) if the second prediction unit 405 determines not to use the expanded address adr (n−k) and calculates a prediction value predD (n)=dec (n−k)+$\gamma$ using the third predetermined value $\gamma$ for the expanded address adr (n−k) if the second prediction unit 405 determines to use the expanded address adr (n−k). Here, k, m, $\alpha$, $\beta$, and $\gamma$ may be the same as in the third embodiment.

In the configuration shown in FIG. 10, in a case where the first prediction unit 101, the determination unit 102, and the compression unit 103 are the prediction unit 101, the determination unit 102, and the compression unit 103 according to the first embodiment or the second embodiment, it is possible to calculate the prediction value predD (n) without actually using the analysis information. In this case, the analysis unit 404 and the second prediction unit 405 may be provided in parallel to each other between the input for the compressed data and the input of the expansion unit 406 rather than in series.

When compressed data is compressed by the prediction unit 101, the determination unit 102, and the compression unit 103 in any of the first to third embodiments, then if any of the encoded data cd (n) to be processed was encoded by the second encoding processing, the address data adr (n) is directly included in the encoded data cd (n). Therefore, such a case, the calculation of the prediction value predD (n) by the second prediction unit 405 may be omitted for these values, and thus the input of the calculated prediction value predD (n) to the expansion unit 406 may be omitted, and the use of the prediction value predD (n) in the expansion unit 406 may be omitted for these values.

When the compressed data, the prediction value predD (n) of each of the encoded data cd (n), and the decoding processing determined for each of the encoded data cd (n) are input from the second prediction unit 405 and/or the analysis unit 404, the expansion unit 406 restores (remakes) the input data by decoding each of the encoded data cd (n) based on the above input and then outputs the restored data. Specifically, the expansion unit 406 executes any of a first decoding processing, a second decoding processing, and a third decoding processing for each of the encoded data cd (n). The restored input data is the same as the input data that was input to the first prediction unit 101.

In the first decoding processing, the expansion unit 406 decodes the encoded data cd (n) from the analysis information based on the difference value diff (n) included in the encoded data cd (n) to be processed and the prediction value predD (n) to restore the address data adr (n). Specifically, the expansion unit 406 extracts the difference value diff (n) from the analysis information and adds the difference value diff (n) and the prediction value predD (n). Accordingly, the encoded data cd (n) encoded by the piece of first encoding processing is decoded, and the address data adr (n) is restored.

In the second decoding processing, the expansion unit 406 decodes the encoded data cd (n) from the analysis information based on the address data adr (n) included in the encoded data cd (n) to be processed to restore the address data adr (n). Specifically, the expansion unit 406 extracts the address data adr (n) from the analysis information and sets the address data adr (n) as decoded data. Accordingly, the encoded data cd (n) encoded by the piece of second encoding processing is decoded, and the address data adr (n) is restored.

Furthermore, in the third decoding processing, the expansion unit 406 generates the decoded data of the encoded data cd (n) from the prediction value predD (n). Specifically, the expansion unit 406 sets the prediction value predD (n) as the decoded data. Accordingly, the encoded data cd (n) encoded by the piece of third encoding processing is decoded, and the address data adr (n) is restored.

Next, an operation example of the data processing apparatus 400 according to the fourth embodiment will be described. However, since the compression operation according to the fourth embodiment may be the same as in the first to third embodiments, a detailed description thereof will be omitted herein.

Figure 11:
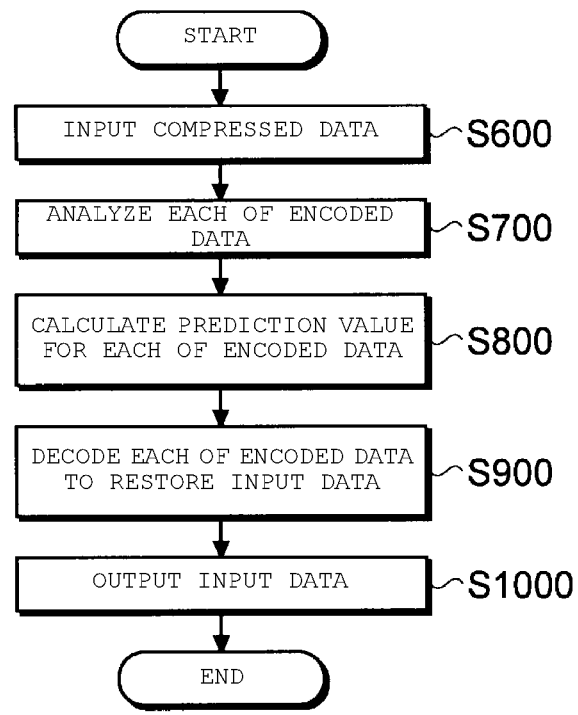
FIG. 11 is a flowchart showing an example of an expansion operation executed by the data processing apparatus according to a fourth embodiment.

FIG. 11 is a flowchart showing an example of an expansion operation executed by the data processing apparatus according to the embodiment. As shown in FIG. 11, in the expansion operation according to the embodiment, the data processing apparatus 400 first receives the compressed data to be expanded (decoded/decompressed) from the outside (step S600). Next, the data processing apparatus 400 sends the compressed data to the analysis unit 404, which analyzes each of the encoded data cd (n) to acquire the processing flag flag (n) and the like from the encoded data cd (n) as analysis information (step S700). Next, the data processing apparatus 400 sends the compressed data and the analysis information to the second prediction unit 405 to calculate the prediction value predD (n) for each of the encoded data cd (n) (step S800). Next, the data processing apparatus 400 sends the compressed data, the analysis information, and the prediction values predD (n) to the expansion unit 406, which decodes each of the encoded data cd (n) by the decoding processing specified by the processing flag flag (n) (included in the analysis information) so as to expand the compressed data and thereby restore the input data (step S900). Subsequently, the data processing apparatus 400 outputs the restored input data (step S1000) and ends the operation.

Figure 12:
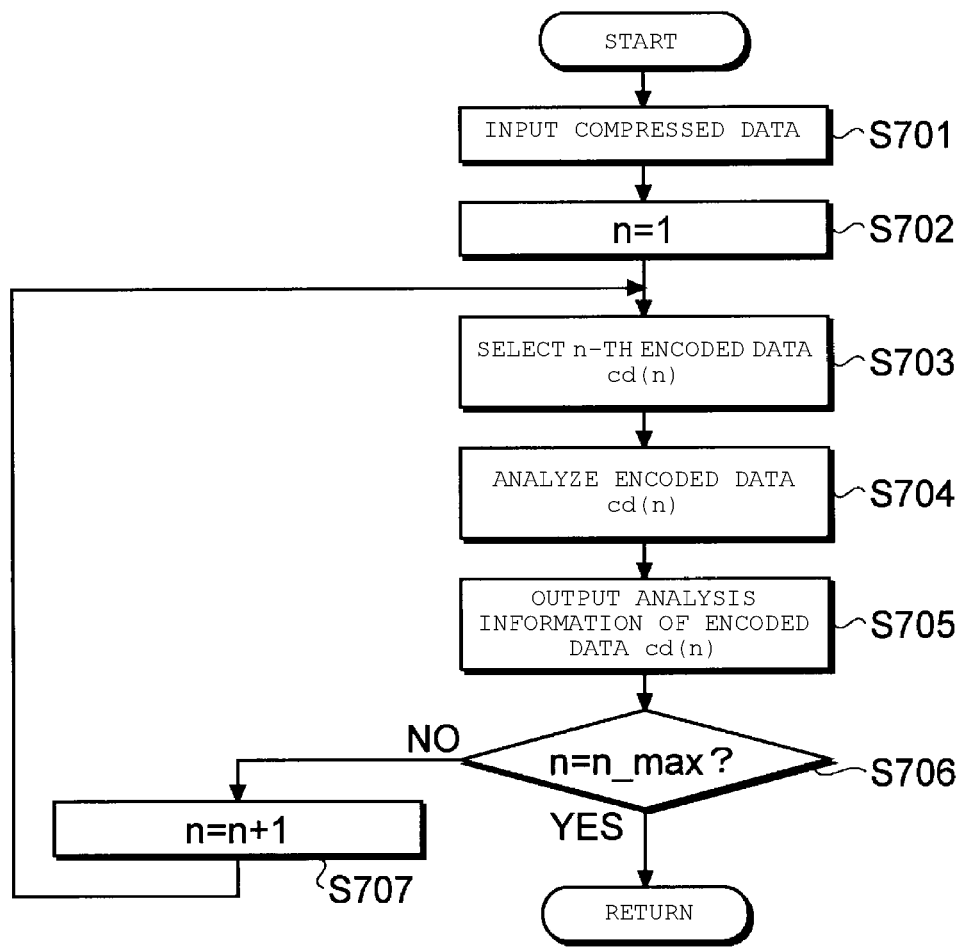
FIG. 12 is a flowchart showing an example of an analysis operation according to a fourth embodiment.

An analysis operation executed by the analysis unit 404 in step S700 of FIG. 11 will be described. FIG. 12 is a flowchart showing an example of the analysis operation according to an embodiment.

As shown in FIG. 12, when the compressed data is received as input (step S701), the analysis unit 404 sets n=1 for specifying the encoded data cd (n) to be processed in the compressed data (step S702).

Next, the analysis unit 404 selects the present n-th encoded data cd (n) in the compressed data as the encoded data cd (n) to be processed (step S703). Subsequently, the analysis unit 404 analyzes the selected encoded data cd (n) to acquire the processing flag flag (n) and the like included in the encoded data cd (n) and, as necessary, specifies the address data adr (n), the difference value diff (n), the additional information, and the like (step S704), and outputs the specified address data adr (n), difference value diff (n), additional information, and the like (as analysis information) to the second prediction unit 405 (step S705). The analysis unit 404 may store the specified pieces of information in a predetermined memory area for the analysis information and may collectively output the these pieces of analysis information to the second prediction unit 405 after the analysis for all the encoded data cd (n) has been completed.

Next, the analysis unit 404 determines whether n is the maximum value n_max, that is, whether the encoded data cd (n) currently being selected is the last encoded data cd (n_max) in the compressed data (step S706). In a case where n is not the maximum value n_max (NO in step S706), the analysis unit 404 proceeds to step S707, increments the variable n by 1 and returns to step S703. In a case where n is the maximum value n_max (YES in step S706), the analysis unit 404 returns to the operation shown in FIG. 11.

A prediction value calculation operation executed by the second prediction unit 405 in step S800 of FIG. 11 will be described.

Figure 13:
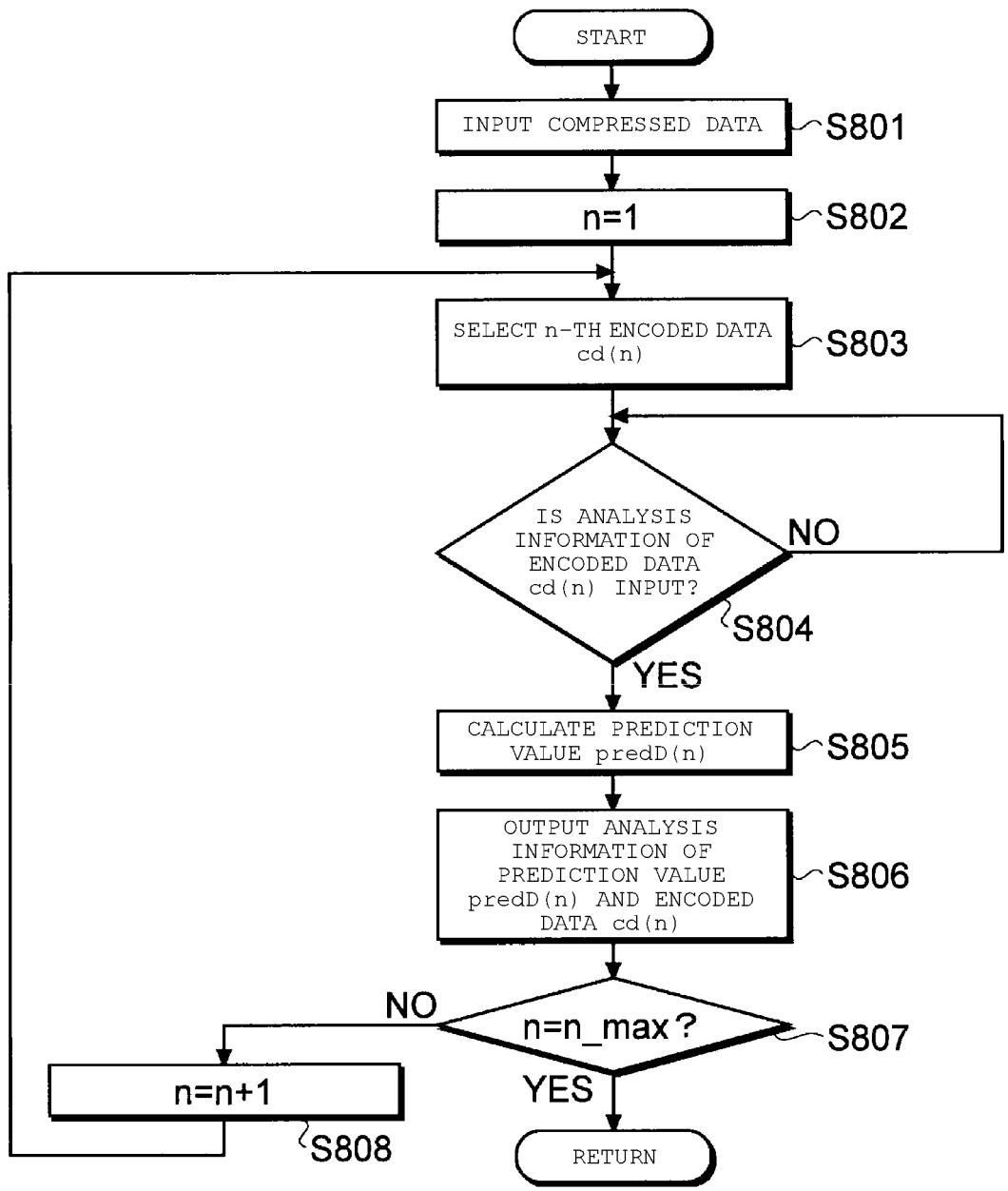
FIG. 13 is a flowchart showing an example of a prediction value calculation operation according to a fourth embodiment.

FIG. 13 is a flowchart that shows an example of a prediction value calculation operation according to an embodiment and shows an example of the prediction value calculation operation executed when the compressed data generated by the compression operation according to the first embodiment is expanded. The operation shown in FIG. 13, that is, the operation in step S800 of FIG. 11 may be so-called pipeline processing, which is executed in parallel with the execution of the operations of the analysis unit 404 shown in FIG. 12.

As shown in FIG. 13, in the prediction value calculation operation executed by the second prediction unit 405 for the compressed data generated by the compression operation according to the first embodiment, for example, when the compressed data is input through the analysis unit 404 (step S801), the second prediction unit 405 sets n=1 for the encoded data cd (n) to be processed (step S802) and selects the n-th encoded data cd (n) in the compressed data as the encoded data cd (n) to be processed (step S803). In a case where the second prediction unit 405 waits for analysis information specified for encoded data cd (n) being selected to be input from the analysis unit 404 (NO in step S804) and the analysis information is input (YES in step S804), the second prediction unit 405 calculates a prediction value predD (n) for the encoded data cd (n) based on the processing flag flag (n) included in the analysis information of the encoded data cd (n) (step S805) as described above. Subsequently, the second prediction unit 405 outputs the calculated prediction value predD (n) together with the analysis information of the encoded data cd (n) to the expansion unit 406 (step S806) and proceeds to step S807. The second prediction unit 405 may store the calculated prediction value predD (n) together with the analysis information and may collectively output the stored prediction values predD (n) and pieces of analysis information to the expansion unit 406 after the calculation of the prediction value predD (n) for all the encoded data cd (n) has been completed.

In step S807, the second prediction unit 405 determines whether n is the maximum value n_max. In a case where n is not the maximum value n_max (NO in step S807), the second prediction unit 405 proceeds to step S808, increments the variable n by 1, and returns to step S803. In a case where n is the maximum value n_max (YES in step S807), the second prediction unit 405 returns to the operation shown in FIG. 11.

Figure 14:
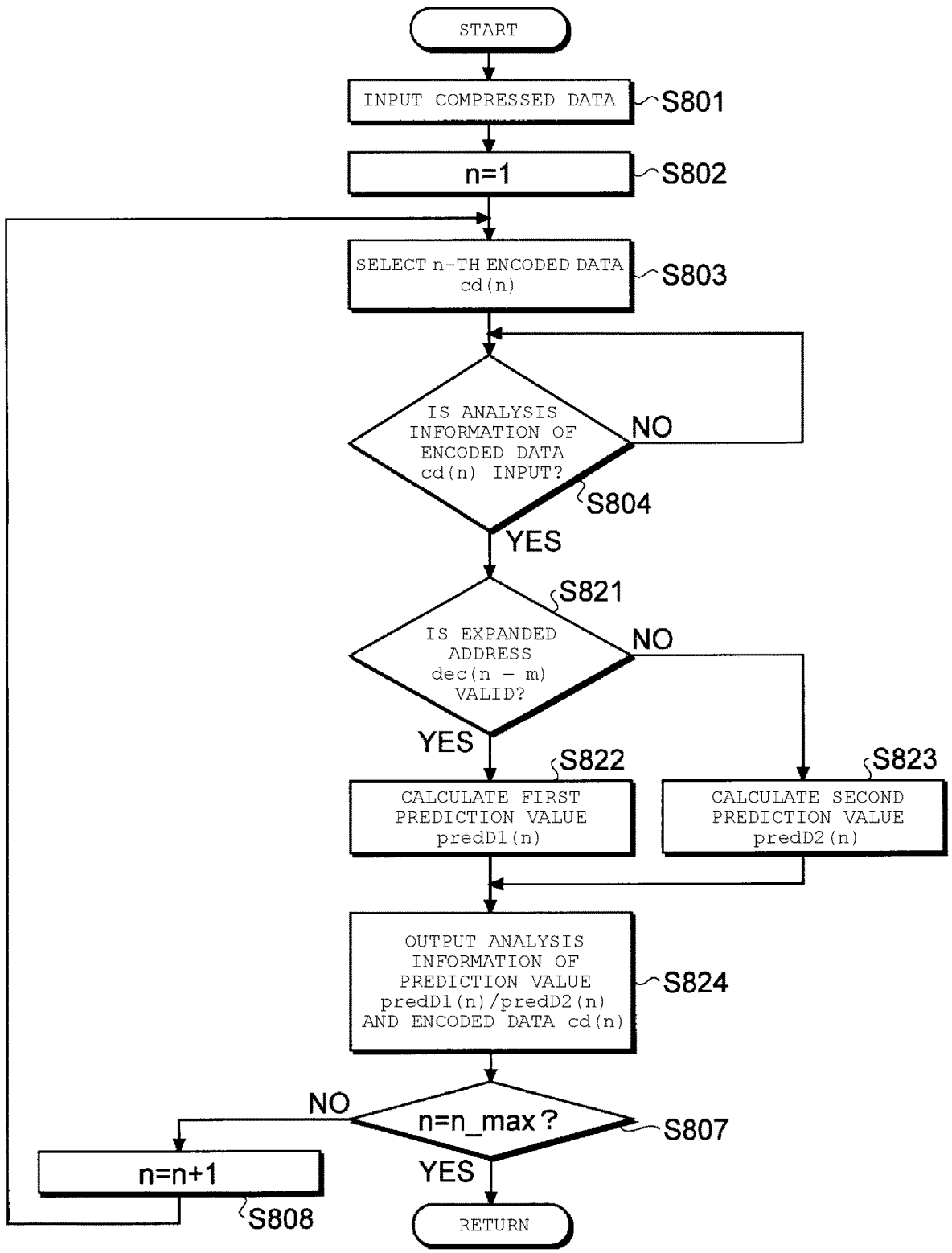
FIG. 14 is a flowchart showing another example of a prediction value calculation operation according to a fourth embodiment.

FIG. 14 is a flowchart that shows another example of the prediction value calculation operation according to an embodiment and shows an example of the prediction value calculation operation executed when the compressed data generated by the compression operation according to the second embodiment is expanded. In FIG. 14, certain operations (S801 to S804, S807, and S808) are substantially similar to those previously described in conjunction with FIG. 13 and will not be described again. The operation in FIG. 14 may be so-called pipeline processing which can be executed in parallel with the execution of the operation of the analysis unit 404 shown in FIG. 12, similarly to the operation shown in FIG. 13.

As shown in FIG. 14, in the prediction value calculation operation executed by the second prediction unit 405 for the compressed data generated by the compression operation according to the second embodiment, the operations in steps S805 and S806 in FIG. 13 are replaced with operations shown in steps S821 to S824.

That is, when the analysis information of the selected encoded data cd (n) is input from the analysis unit 404 (YES in step S804), the second prediction unit 405 determines whether expanded data dec (n—m) used for the calculation of the prediction value predD (n) is a valid address (step S821). In a case where the expanded address dec (n–m) is a valid address (YES in step S821), the second prediction unit 405 calculates a first prediction value predD1 (n)=dec (n–m)+α using the first predetermined value α (step S822) and proceeds to step S824. In a case where the expanded address dec (n–m) is an invalid address (NO in step S821), the second prediction unit 405 calculates a second prediction value predD2 (n)=dec (n–m)+β for the invalid address using the second predetermined value β (step S823) and proceeds to step S824. In step S824, the second prediction unit 405 outputs the first prediction value predD1 (n) or the second prediction value predD2 (n) as calculated in step S822 or S823 together with the analysis information of the encoded data cd (n) to the expansion unit 406.

Figure 15:
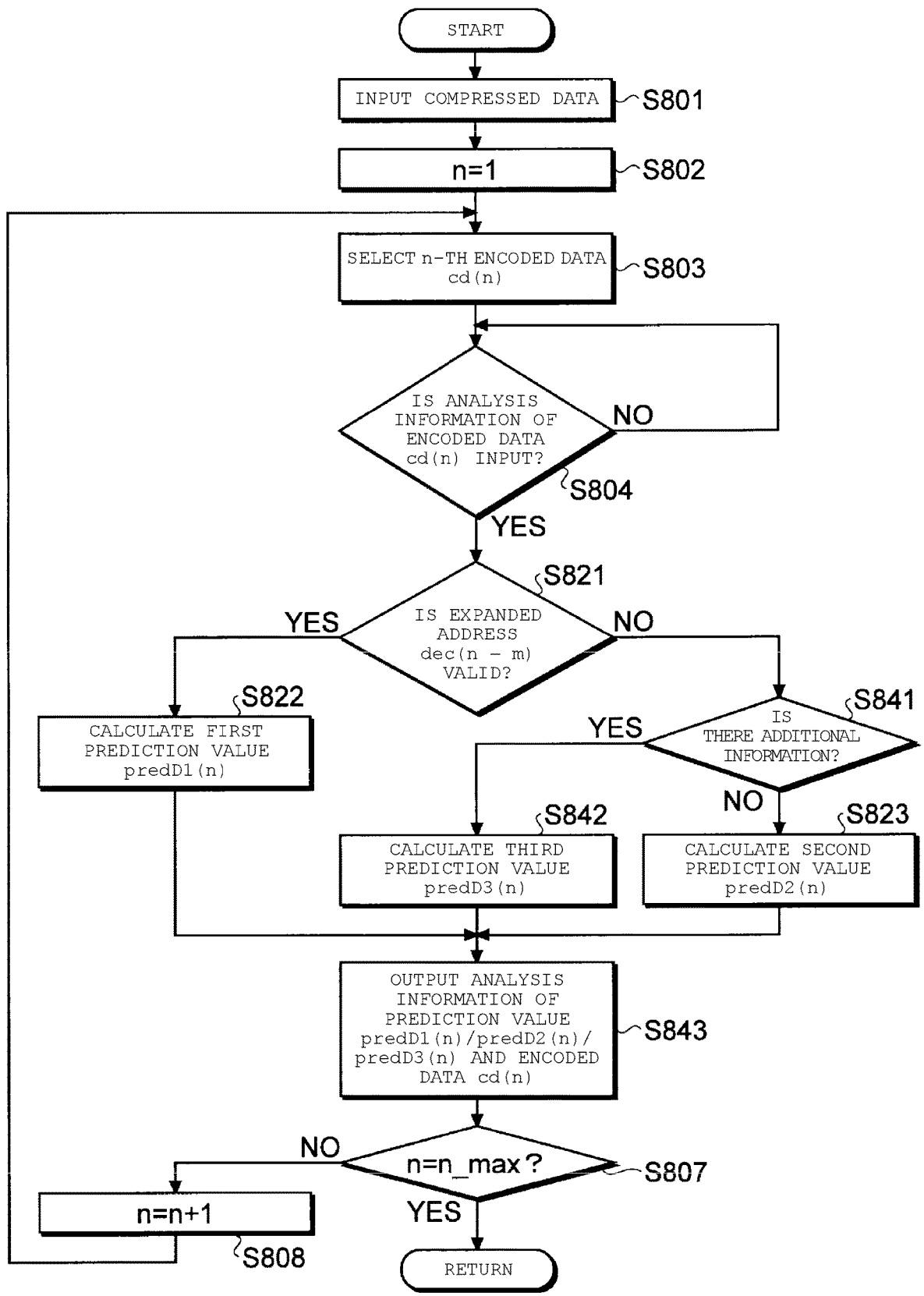
FIG. 15 is a flowchart showing still another example of a prediction value calculation operation according to a fourth embodiment.

FIG. 15 is a flowchart that shows still another example of the prediction value calculation operation according to an embodiment and shows an example of the prediction value calculation operation executed when the compressed data generated by the compression operation according to the third embodiment is expanded. In FIG. 15, aspects having reference labels previously used in conjunction with FIG. 13 and/or FIG. 15 can be considered as substantially similar to those previously described aspects and further description may be omitted. The operation in FIG. 15 may be so-called pipeline processing which is executed in parallel with the execution of the operation of the analysis unit 404 shown in FIG. 12, similarly to the operation shown in FIG. 13.

As shown in FIG. 15, in the prediction value calculation operation executed by the second prediction unit 405 for the compressed data generated by the compression operation according to the third embodiment, the operations in steps S805 and S806 in FIG. 13 are replaced with operations shown in steps S821 to S823 and S841 to S843. The operations in steps S821 to S823 may be considered the same as the operations in steps S821 to S823 shown in FIG. 14.

That is, when the expanded address dec (n–m) is not a valid address (NO in step S821), the second prediction unit 405 determines whether the additional information is included in the analysis information of the encoded data cd (n) (step S841) in the determination in step S821. As was described also in the context of the third embodiment, the additional information indicates that the prediction value pred (n) was calculated using the address data adr (n–k), which is the latest valid address, instead of address data adr (n–m) when the encoded data cd (n) was generated. In a case where the additional information is not included in the analysis information of the encoded data cd (n) (NO in step S841), the second prediction unit 405 calculates the second prediction value predD2 (n)=dec (n–m)+β for the invalid address using, for example, the second predetermined value β (step S823), similarly to the operation shown in step S823 in FIG. 14, and proceeds to step S843. In a case where the additional information is included in the analysis information of the encoded data cd (n) (YES in step S841), the second prediction unit 405 calculates a third prediction value predD3 (n)=dec (n–k)+γ using, for example, the third predetermined value γ based on an expanded address dec (n–k) (step S842) and proceeds to step S843. In step S843, the second prediction unit 405 outputs the first prediction value predD1 (n), the second prediction value predD2 (n), or the third prediction value predD3 (n) calculated in step S822, S823, or S842 along with the analysis information of the encoded data cd (n) to the expansion unit 406, as in step S807 of FIG. 13.

Figure 16:
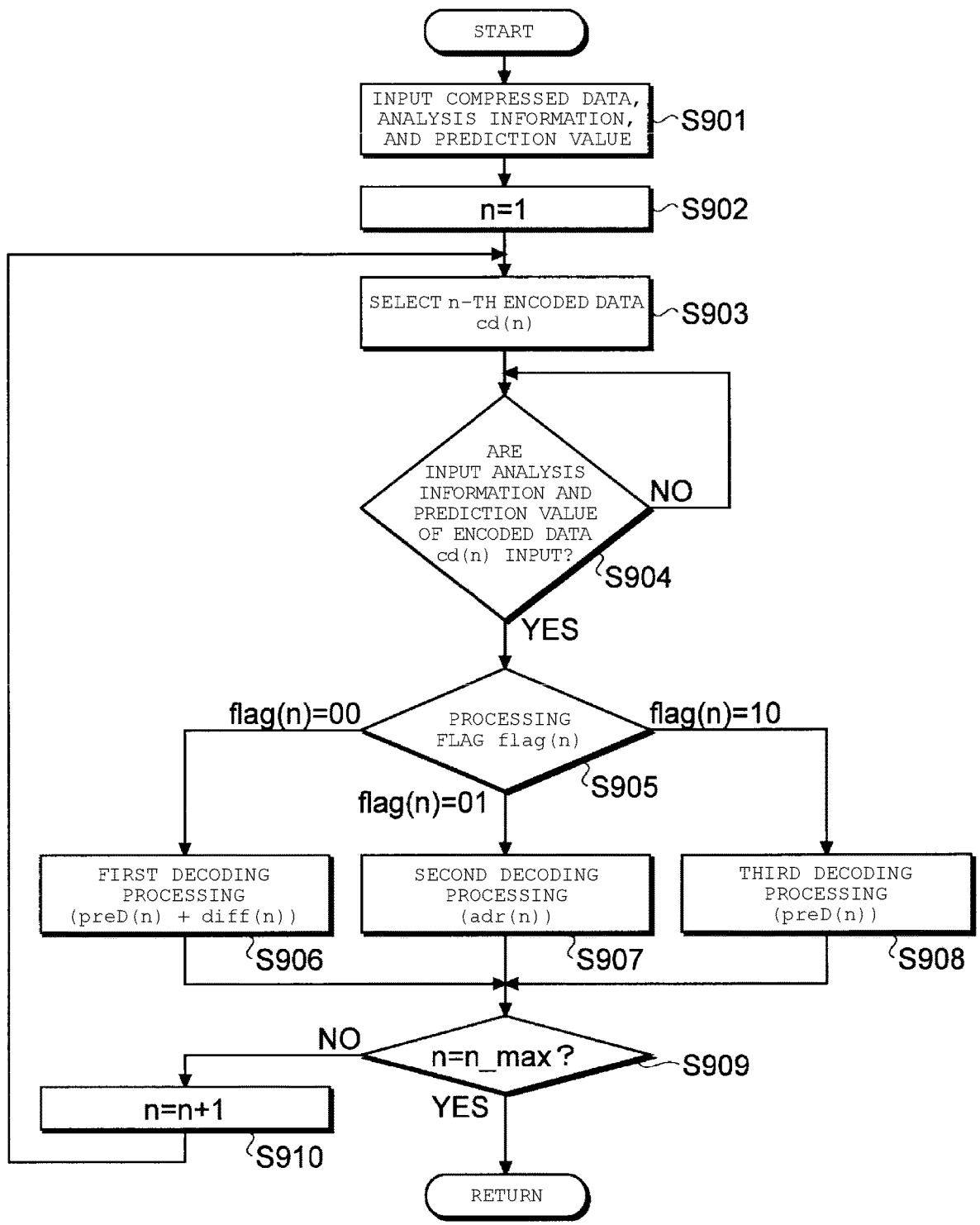
FIG. 16 is a flowchart showing an example of an expansion operation according to a fourth embodiment.

Subsequently, the expansion operation executed by the expansion unit 406 in step S900 of FIG. 11 will be described. FIG. 16 is a flowchart showing an example of the expansion operation according to an embodiment. The operation shown in FIG. 16, that is, the operation in step S900 of FIG. 11 may be so-called pipeline processing which is executed in parallel with the execution of the operation of the second prediction unit 405 shown in any of FIGS. 13 to 15.

As shown in FIG. 16, when the compressed data is input through the second prediction unit 405 (step S901), the expansion unit 406 sets n=1 for specifying the encoded data cd (n) to be processed (step S902) and selects the n-th encoded data cd (n) in the compressed data as the encoded data cd (n) to be processed (step S903). When the expansion unit 406 waits for a prediction value and analysis information specified for encoded data cd (n) being selected to be input from the second prediction unit 405 (NO in step S904) and the prediction value and the analysis information are input (YES in step S904), the expansion unit 406 specifies the processing flag flag (n) included in the analysis information of the selected encoded data cd (n) (step S905).

In a case where the processing flag flag (n) is "00" (flag (n)=00 in step S905), that is, the encoded data cd (n) is encoded by the piece of first encoding processing, the expansion unit 406 adds the prediction value predD (n) and the difference value diff (n) included in the analysis information to execute the first decoding processing of generating the decoded data of the encoded data cd (n) (step S906) and proceeds to step S909. The generated decoded data is accumulated in the predetermined memory area.

In a case where the processing flag flag (n) is "01" (flag (n)=01 in step S905), indicating the encoded data cd (n) was encoded by the second encoding processing, the expansion unit 406 executes the second decoding processing that sets the address data adr (n) included in the analysis information as the decoded data of the encoded data cd (n) (step S907) and proceeds to step S909. The generated decoded data is accumulated in the predetermined memory area.

Furthermore, in a case where the processing flag flag (n) is "10" (flag (n)=10 in step S905), that is, the encoded data cd (n) is encoded by the first encoding processing, the expansion unit 406 executes the third decoding processing that sets the prediction value predD (n) calculated for the encoded data cd (n) the decoded data of the encoded data cd (n) (step S908) and proceeds to step S909. The generated decoded data is accumulated in the predetermined memory area.

In step S909, the expansion unit 406 determines whether n is the maximum value n_max. In a case where n is not the maximum value n_max (NO in step S909), the expansion unit 406 proceeds to step S910, increments the variable n by 1, and returns to step S903. In a case where n is the maximum value n_max (YES in step S909), the expansion unit 406 returns to the operation shown in FIG. 11. Accordingly, the original input data obtained by expanding the compressed data is accumulated in the predetermined memory area.

According to an embodiment, it is possible to provide the data processing apparatus 400 capable of accurately expanding the data effectively compressed by the compression operation according to the first to third embodiments.

Since other configurations, operations, and effects are the same as those in the embodiments described above, a detailed description will be omitted herein.

Fifth Embodiment

In the fifth embodiment, a case in which the data processing apparatus 400 of the fourth embodiment is employed in a memory apparatus or memory system will be described.

Figure 17:
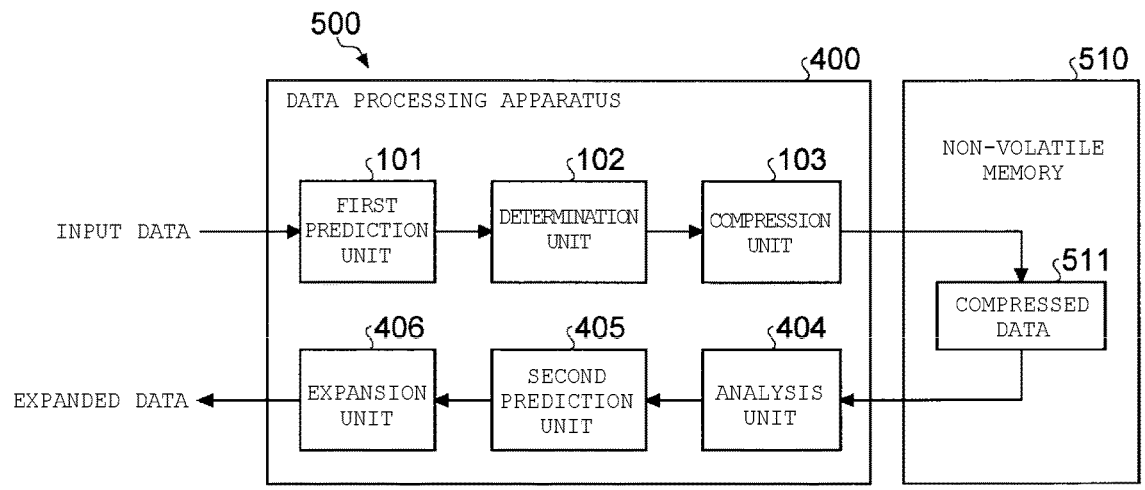
FIG. 17 is a block diagram showing a schematic configuration example of a memory system according to a fifth embodiment.

FIG. 17 is a block diagram showing a schematic configuration example of the memory system according to the fifth embodiment. As shown in FIG. 17, a memory system 500 includes a data processing apparatus 400 and a non-volatile memory 510 that stores compressed data 511 that has been output from the data processing apparatus 400. The non-volatile memory 510 is a non-volatile memory that stores data, for example, a NAND flash type memory (hereinafter, referred to as NAND memory). However, the present disclosure is not limited to NAND memory and various memory media types other than the NAND memory, such as a three-dimensional flash memory, a resistive random access memory (ReRAM), or a ferroelectric random access memory (FeRAM), may be used as the non-volatile memory 510. The non-volatile memory 510 is not required to be a semiconductor memory, and various memory media other than the semiconductor based memory units or types may be employed in an embodiment.

Figure 18:
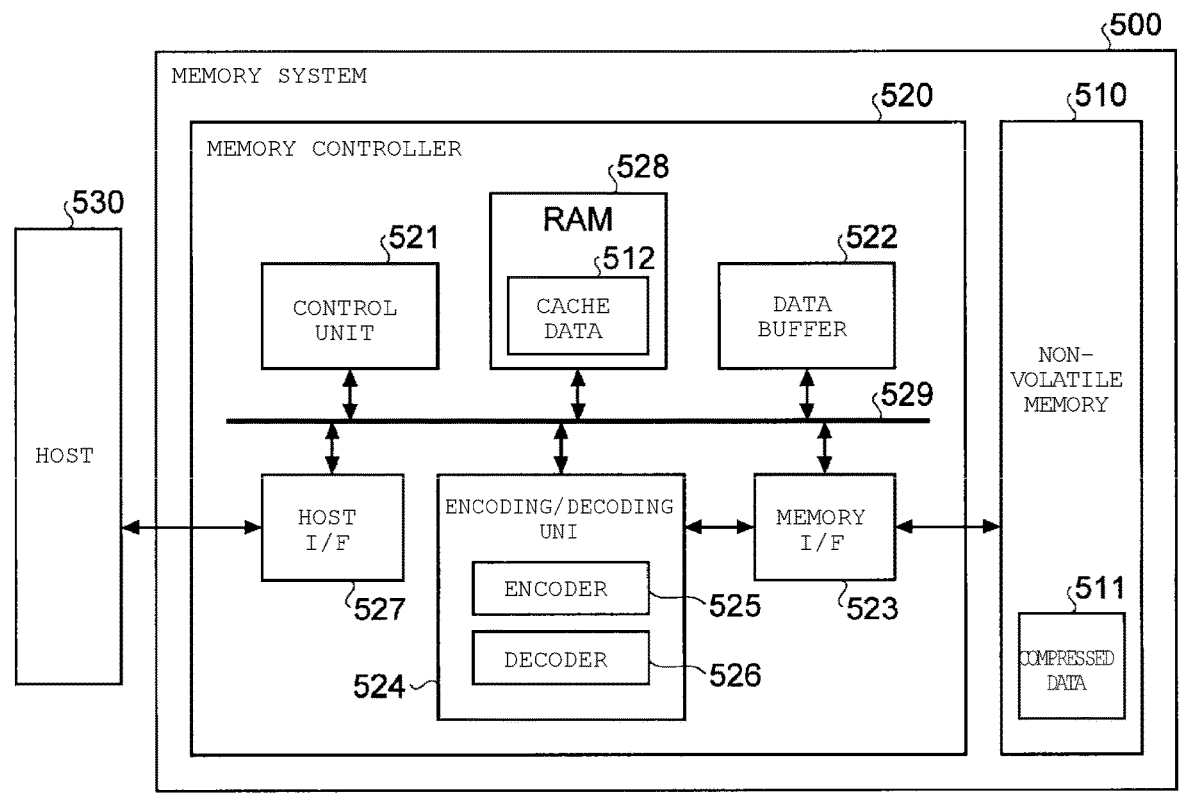
FIG. 18 is a block diagram showing additional aspects of a configuration example of the memory system according to the fifth embodiment.

FIG. 18 shows a configuration example of the memory system 500 according to an embodiment. As shown in FIG. 18, the memory system 500 includes a memory controller 520 and the non-volatile memory 510. The memory system 500 can be connected to a host 530 which is an external apparatus. The host 530 may be an electronic device such as a personal computer or a mobile computing terminal.

The memory system 500 including the non-volatile memory 510 may be a so-called solid state drive (SSD) or a memory card in which the memory controller 520 and the non-volatile memory 510 are configured as one, integrated package.

The memory controller 520 controls writing to the non-volatile memory 510 according to a write request from the host 530. The memory controller 520 controls reading from the non-volatile memory 510 according to a read request from the host 530. The memory controller 520 includes a host I/F (host interface) 527, a memory I/F (memory interface) 523, a control unit 521, an encoding/decoding unit (codec) 524, a data buffer 522, and a random access memory (RAM) 528. The host I/F 527, the memory I/F 523, the control unit 521, the codec 524, the data buffer 522, and the RAM 528 are connected to each other through an internal bus 529.

The host I/F 527 executes processing according to an interface standard with the host 530 and outputs a command received from the host 530, user data to be written, and the like to internal bus 529. The host I/F 527 transmits user data which is read and restored from the non-volatile memory 510, a response from the control unit 521, and the like to the host 530.

The memory I/F 523 performs write processing to the non-volatile memory 510 based on an instruction of the control unit 521. The memory I/F 523 performs read processing from the non-volatile memory 510 based on an instruction of the control unit 521.

The data buffer 522 temporarily stores the user data received from the host 530 by the memory controller 520 before the user data is stored in the non-volatile memory 510. The data buffer 522 temporarily stores the user data which is read and restored from the non-volatile memory 510 before the user data is transmitted to the host 530. A general-purpose memory such as a static random access memory (SRAM), a dynamic random access memory (DRAM), or a synchronous dynamic random access memory (SDRAM) may be used as the data buffer 522.

The codec 524 includes an encoder 525 that encodes the user data temporarily stored in the data buffer 522 to generate a code word written to the non-volatile memory 510 and a decoder 526 that decodes a received word read from the non-volatile memory 510 to restore the user data. Control data and the like used inside the memory controller 520, such as the logical-physical conversion table, other than the user data may be included in the data encoded by the codec 524. For example, an encoding method using an algebraic code such as the Bose-Chaudhuri-Hocquenghem (BCH) code, an encoding method using a code based on a sparse graph such as a low-density parity-check (LDPC) code, or the like may be employed as an encoding method of the codec 524 in addition to the encoding method using the variable-length code such as the Huffman code exemplified in the first embodiment.

The control unit 521 integrally controls each configuration element of the memory system 500. When a command is received via the host I/F 527 from the host 530, the control unit 521 performs control according to the command. For example, the control unit 521 instructs the memory I/F 523 to write the user data which is received from the host 530 together with the write request and accumulated in the data buffer 522 to the non-volatile memory 510 according to the write request from the host 530. The control unit 521 instructs the memory I/F 523 to read the user data from the non-volatile memory 510 according to the read request from the host 530.

The control unit 521 manages the correlation between a logical address indicating a storing position of the user data received from the host 530 on the logical address space and a physical address indicating a storing area on the physical address space where the user data is actually stored. The management of the correlation is performed using the logical-physical conversion table. When the write request is received from the host 530, the control unit 521 determines a storing area (memory area) on the non-volatile memory 510 and stores a physical address indicating the determined storing area and a logical address notified from the host 530 in correlation with each other in the logical-physical conversion table for the user data which is received from the host 530 together with the write request and accumulated in the data buffer 522. When the read request is received from the host 530, the control unit 521 converts a logical address designated by the read request into a physical address using the logical-physical conversion table described above and instructs the memory I/F 523 to read the user data from the physical address.

The logical-physical conversion table managed by the control unit 521 is stored, for example, in a predetermined area in the non-volatile memory 510. In an embodiment, the logical-physical conversion table stored in the non-volatile memory 510 is compressed by one of the compression operations according to the first to third embodiments. It is possible to reduce a size of the logical-physical conversion table in the non-volatile memory 510 by compressing the logical-physical conversion table into the compressed data 511. As a result, it is possible to enhance memory efficiency of the non-volatile memory 510.

A part or all of the logical-physical conversion table (or compressed data 511 thereof) in the non-volatile memory 510 can be read and stored in the RAM 528 as cache data 512 as necessary. The RAM 528 is, for example, cache memory used as a work area of the control unit 521 provided in the memory system 500 and stores various data such as a loaded firmware and various conversion tables. The RAM 528 may be provided in the memory controller 520 and may be provided separately from the memory controller 520. For example, the DRAM, the SRAM, and the like may be used as the RAM 528.

The RAM 528 commonly has a delay time in access that is shorter than the non-volatile memory 510. Therefore, it is possible to reduce the delay time when the control unit 521 changes the logical address to the physical address and to reduce latency of the memory system 500 by storing the part or all of the logical-physical conversion table in the RAM 528 as the cache data 512.

It is possible to enhance a cache hit rate when the control unit 521 changes the logical address to the physical address by caching more data (correlations between the logical addresses and the physical addresses) of the logical-physical conversion table in the RAM 528. In an embodiment, the cache data 512 (a part or all of the logical-physical conversion table) stored in the RAM 528 is compressed by the compression operation according to the first to third embodiments described above. The cache data 512 is set as the compressed data. Accordingly, since it is possible to cache a greater amount of table data in the RAM 528, the cache hit rate when the control unit 521 changes the logical address to the physical address can be enhanced. As a result, it is possible to further reduce the latency of the memory system 500.

In an embodiment, the data processing apparatus 400 shown in FIG. 17 is implemented by the control unit 521 of the memory controller 520. However, the present disclosure is not limited thereto and can be modified, such as a configuration in which the data processing apparatus 400 is separately provided from the control unit 521 and connected to the internal bus 529.

According to an embodiment, the logical-physical conversion table stored in the non-volatile memory 510 can be effectively compressed by the compression operation according to the first to third embodiments. Accordingly, it is possible to reduce the size of the logical-physical conversion table (as compressed data 511) to be stored in the non-volatile memory 510. As a result, it is possible to enhance the memory efficiency of the non-volatile memory 510 by utilizing less of non-volatile memory 510 to store the logical-physical conversion table data.

According to an embodiment, the cache data 512 in the RAM 528 can be effectively compressed by the compression operation according to the first to third embodiments described above. Accordingly, since it is possible to cache a lot of table data in the RAM 528, the cache hit rate when the control unit 521 changes the logical address to the physical address can be enhanced. As a result, it is possible to further reduce the latency of the memory system 500.

The data which is compressed by the compression operation according to the first to third embodiments and stored in the RAM 528 is not necessarily limited to the cache data 512 and may be various other data such as firmware and/or other conversion tables.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A data processing apparatus for compressing physical address values correlated to logical address values, the data processing apparatus being configured to:
   calculate a first predicted address value for a first input address value in input data to be compressed;
   select an encoding processing for the first input address value according to the first predicted address value; and
   encode the first input address value according to the selected encoding processing, wherein
   the data processing apparatus is further configured to either select a predetermined value as the first predicted address value or calculate the first predicted address value based on a predicted address value for an input address value processed before the first input address value, and
   the data processing apparatus is further configured to calculate the first predicted address value using a first parameter when the input address value processed before the first input address value is for a valid address and calculate the first predicted address value using a second parameter, different from the first parameter, when the input address value processed before the first input address value is for an invalid address.

2. The data processing apparatus according to claim 1, wherein the data processing apparatus selects the encoding processing based on a difference between the first input address value and the first predicted address value.

3. The data processing apparatus according to claim 2, wherein
   the data processing apparatus is configured to execute a first encoding processing in which a value of the difference between the first input address value and the first predicted address value is output as encoded data and a second encoding processing in which the first input address value is output as the encoded data, and the data processing apparatus selects the first encoding processing when an absolute value of the value of the difference between the first input address value and the first predicted address value is less than or equal to a predetermined threshold value, and selects the second encoding processing when the absolute value of the value of the difference between the first input address value and the first predicted address value is greater than the predetermined threshold value.

4. The data processing apparatus according to claim 3, wherein
the data processing apparatus sets a flag for specifying the selected encoding processing for the first input address value, and
the encoded data output for the first input address value includes the flag.

5. The data processing apparatus according to claim 4, wherein
the data processing apparatus is further configured to execute a third encoding processing in which the flag is output as the encoded data for the first input address value, and
selects the third encoding processing when the difference value is equal to zero.

6. The data processing apparatus according to claim 1, wherein the first input address value is a physical address in a storage device, and the first input address value is correlated to a logical address utilized by a host device connected to the storage device.

7. The data processing apparatus according to claim 1, wherein the data processing apparatus is configured to:
generate added flag information to indicate that the first predicted address value is in series of predicted address values for invalid input address values, and
include the added flag information in the encoded data.

8. The data processing apparatus according to claim 1, wherein the first input address value is correlated to a first logical address value in a look-up table.

9. The data processing apparatus according to claim 1, wherein the data processing apparatus is further configured to:
decode the encoded data using a decoding processing corresponding to the encoding processing used in generating the encoded data and restore the first input address value in correlation with a second address value;
analyze the encoded data and determine the decoding processing to be executed by the expansion unit; and
provide a second prediction value of the encoded data.

10. The data processing apparatus according to claim 9, wherein
each piece of the encoded data includes a flag for specifying the encoding processing that was executed on the piece of the encoded data, and
the data processing apparatus is configured to evaluate the flag included in the encoded data and select the decoding processing to be executed on the piece of encoded data based on the flag.

11. The data processing apparatus according to claim 9, wherein the data processing apparatus is configured to select a predetermined prediction value when a piece of the encoded data selected for decoding processing is a first piece of encoded data in a series of encoded data pieces.

12. The data processing apparatus according to claim 11, wherein the data processing apparatus is configured to calculate the second prediction value using a third parameter when the piece of encoded data selected for decoding processing is preceded in the series by encoded data for a valid address and calculate the second prediction value using a fourth parameter, different from the third parameter, when the piece of encoded data selected for decoding processing is preceded in the series by encoded data for an invalid address.

13. The data processing apparatus according to claim 9, wherein
the data processing apparatus either selects a predetermined value as the first predicted address value or calculates the first predicted address value based on a predicted address value for an input address value processed before the first input address value,
the data processing apparatus is configured to generate added flag information to indicate that the first predicted address value is in series of predicted address values for invalid input address values, and
the data processing apparatus is configured to include the added flag information in the encoded data.

14. The data processing apparatus according to claim 9, wherein
the first input address value is a physical address correlated to a logical address in a logical address space of a memory device, and
the correlation is between the first input address value and the logical address in a logical-to-physical table.

15. A memory system, comprising:
a data processing apparatus according to claim 1; and
a non-volatile memory that stores encoded data output from the data processing apparatus.

16. A memory system connectable to a host apparatus, the memory system comprising:
a memory controller;
a volatile memory accessible by the memory controller;
a nonvolatile memory connected to the memory controller and including a plurality of blocks, wherein
the memory controller is configured to:
manage an address translation table for translation of logical addresses used by the host apparatus and physical addresses in the nonvolatile memory,
compress the address translation table;
store the compressed address translation table in the nonvolatile memory, and
load at least a portion of the compressed address translation table into the volatile memory, wherein
the memory controller compresses the address translation table by:
calculating a first predicted address value for a first input address value in input data to be compressed;
selecting an encoding processing for the first input address value according to the first predicted address value; and
encoding the first input address value according to the selected encoding processing, wherein
the memory controller is further configured to:
select a predetermined value as the first predicted address value or calculate the first predicted address value based on a predicted address value for an input address value processed before the first input address value,
calculate the first predicted address value using a first parameter when the input address value processed before the first input address value is for a valid address, and
calculate the first predicted address value using a second parameter, different from the first parameter, when the input address value processed before the first input address value is for an invalid address.

17. The memory system according to claim 16, wherein the memory controller is further configured to:
   decode the encoded data using a decoding processing corresponding to encoding processing used in generating the encoded data and restore the first input address value in correlation with a second address value,
   analyze the encoded data and determine the decoding processing to be executed, and
   provide a second prediction value of the encoded data.

18. The memory system according to claim 16, wherein the memory controller is configured to:
   calculate a difference between the first input address value and the first predicted address value,
   select a first encoding processing when an absolute value of the calculated difference is less than or equal to a predetermined threshold value,
   select a second encoding processing when the absolute value of the calculated difference is greater than the predetermined threshold value, wherein
   in the first encoding processing, the calculated difference is output as encoded data, and
   in second encoding processing, the first input address value is output as the encoded data.

* * * * *